(12) United States Patent
Shibuya et al.

(10) Patent No.: US 12,272,626 B2
(45) Date of Patent: Apr. 8, 2025

(54) CONDUCTIVE MEMBERS ATOP SEMICONDUCTOR PACKAGES

(71) Applicant: TEXAS INSTRUMENTS INCORPORATED, Dallas, TX (US)

(72) Inventors: Makoto Shibuya, Tokyo (JP); Masamitsu Matsuura, Beppu (JP); Kengo Aoya, Beppu (JP); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 473 days.

(21) Appl. No.: 17/683,074

(22) Filed: Feb. 28, 2022

(65) Prior Publication Data

US 2023/0275007 A1 Aug. 31, 2023

(51) Int. Cl.
| | |
|---|---|
| *H01L 23/495* | (2006.01) |
| *H01L 21/48* | (2006.01) |
| *H01L 21/56* | (2006.01) |
| *H01L 23/00* | (2006.01) |
| *H01L 23/31* | (2006.01) |

(52) U.S. Cl.
CPC .... *H01L 23/49555* (2013.01); *H01L 21/4842* (2013.01); *H01L 21/565* (2013.01); *H01L 23/3107* (2013.01); *H01L 24/48* (2013.01); *H01L 24/85* (2013.01); *H01L 24/32* (2013.01); *H01L 24/73* (2013.01); *H01L 2224/32245* (2013.01); *H01L 2224/48245* (2013.01); *H01L 2224/73265* (2013.01)

(58) Field of Classification Search
CPC ........... H01L 23/49555; H01L 23/3107; H01L 24/48; H01L 21/4842; H01L 21/565
See application file for complete search history.

(56) References Cited

U.S. PATENT DOCUMENTS

| | | | | |
|---|---|---|---|---|
| 5,978,227 | A * | 11/1999 | Burns | ................. H01L 23/4951 361/813 |
| 8,023,279 | B2 * | 9/2011 | Qian | .................... H05K 7/1432 361/764 |
| 11,682,609 | B2 * | 6/2023 | Koduri | ............. H01L 23/49562 257/666 |
| 2007/0216011 | A1 * | 9/2007 | Otremba | ........... H01L 23/49503 257/E23.044 |
| 2010/0232131 | A1 * | 9/2010 | Qian | ....................... H01L 24/49 361/813 |

(Continued)

*Primary Examiner* — Nathan W Ha
(74) *Attorney, Agent, or Firm* — Xiaotun Qiu; Frank D. Cimino

(57) ABSTRACT

In some examples, a semiconductor package comprises a semiconductor die including a device side having a circuit; a mold compound covering the semiconductor die and the circuit; a first lead coupled to the circuit, the first lead having a gullwing shape and emerging from the mold compound in a first horizontal plane, the first lead having a distal end coincident with a second horizontal plane lower than a bottom surface of the mold compound; and a second lead coupled to the circuit, the second lead emerging from the mold compound in the first horizontal plane, the second lead having a distal end coincident with a third horizontal plane higher than a topmost surface of the mold compound, the distal end of the second lead vertically coincident with the mold compound.

18 Claims, 22 Drawing Sheets

(56) References Cited

U.S. PATENT DOCUMENTS

| | | | |
|---|---|---|---|
| 2014/0210062 A1* | 7/2014 | Miyazaki | H01L 23/49551 257/676 |
| 2014/0239476 A1* | 8/2014 | Ge | H01L 23/34 438/122 |
| 2017/0077020 A1* | 3/2017 | Mabuchi | H01L 23/49555 |
| 2018/0158804 A1* | 6/2018 | Martin | H01L 25/072 |
| 2019/0035707 A1* | 1/2019 | Ikeda | H01L 24/33 |
| 2019/0139869 A1* | 5/2019 | Danny Koh | H01L 23/49575 |
| 2020/0168531 A1* | 5/2020 | Meyers | H01L 23/49503 |
| 2020/0294888 A1* | 9/2020 | Tsuyuno | H01L 25/115 |
| 2020/0402919 A1* | 12/2020 | Matsuda | H01L 21/4821 |
| 2020/0411420 A1* | 12/2020 | Koduri | H05K 3/3426 |
| 2021/0066092 A1* | 3/2021 | Bai | H01L 23/49541 |
| 2022/0028764 A1* | 1/2022 | Schittler Neves | H01L 23/295 |
| 2022/0384317 A1* | 12/2022 | Hussain | H01L 21/4842 |
| 2023/0154827 A1* | 5/2023 | Narayanasamy | H01L 23/49562 257/675 |
| 2023/0260879 A1* | 8/2023 | Koduri | H01L 25/16 257/666 |
| 2023/0395470 A1* | 12/2023 | Fukumoto | H01L 23/4334 |

* cited by examiner

CONDUCTIVE MEMBERS ATOP SEMICONDUCTOR PACKAGES

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire-bonding technique, in which the device side of the semiconductor chip is oriented upward and is coupled to the conductive members using bond wires.

SUMMARY

In some examples, a semiconductor package comprises a semiconductor die including a device side having a circuit; a mold compound covering the semiconductor die and the circuit; a first lead coupled to the circuit, the first lead having a gullwing shape and emerging from the mold compound in a first horizontal plane, the first lead having a distal end coincident with a second horizontal plane lower than a bottom surface of the mold compound; and a second lead coupled to the circuit, the second lead emerging from the mold compound in the first horizontal plane, the second lead having a distal end coincident with a third horizontal plane higher than a topmost surface of the mold compound, the distal end of the second lead vertically coincident with the mold compound.

In some examples, a method for manufacturing a semiconductor package comprises coupling a semiconductor die to first and second leads; applying a mold compound to cover the semiconductor die; forming a gullwing shape in the first lead by bending a distal segment of the first lead to form a foot and bending a proximal segment of the first lead to form a shoulder; bending the second lead toward a topmost surface of the mold compound at a point at which the second lead emerges from the mold compound; positioning the second lead abutting a side surface of the mold compound; bending a distal segment of the second lead to form another foot; and positioning the another foot abutting the topmost surface of the mold compound

DETAILED DESCRIPTION

Directional terms such as "medial," "distal," etc. are used relative to a center (in three-dimensional space) of the semiconductor package being described. The term "conductive member" refers to any conductive metal component such that all package leads are conductive members, but not all conductive members are package leads. Unless otherwise stated, "about," "approximately," or "substantially" preceding a value means +/−10 percent of the stated value. Modifications are possible in the described examples, and other examples are possible within the scope of the claims.

In addition to containing semiconductor dies and circuitry formed on such dies, semiconductor packages may also contain a variety of other components. For example, semiconductor packages may contain passive components, such as inductors, capacitors, and resistors. Space within semiconductor packages is limited, however, and this space becomes even more limited as semiconductor package sizes decrease with time. Despite the increasing scarcity of space within semiconductor packages, passive components continue to undesirably occupy a large amount of space within the packages.

This disclosure describes various examples of a semiconductor package that includes leads formed in a manner that enables the relocation of passive components to areas outside the package. More specifically, the package includes one or more leads that emerge from within the mold compound of the package and extend in an upward direction toward the topmost surface of the package. A distal segment of the one or more leads rests on the topmost surface of the package, with appropriate bends formed in the one or more leads to facilitate this configuration. A component, such as a passive component, is coupled to the one or more leads on the topmost surface of the package. By positioning the component on top of the package instead of inside the package, space within the package is preserved and may be used more efficiently. In some examples, a trench formed in the topmost surface of the package receives a distal end of the one or more leads, and the passive component is coupled to the one or more leads. In some examples, a pair of conductive members are exposed to the topmost surface of the package, and the pair of conductive members are coupled to the package leads inside the package. In such examples, a passive component is coupled to the pair of conductive members exposed to the topmost surface of the package. These and other examples are now described with reference to the drawings.

Figure 1A:
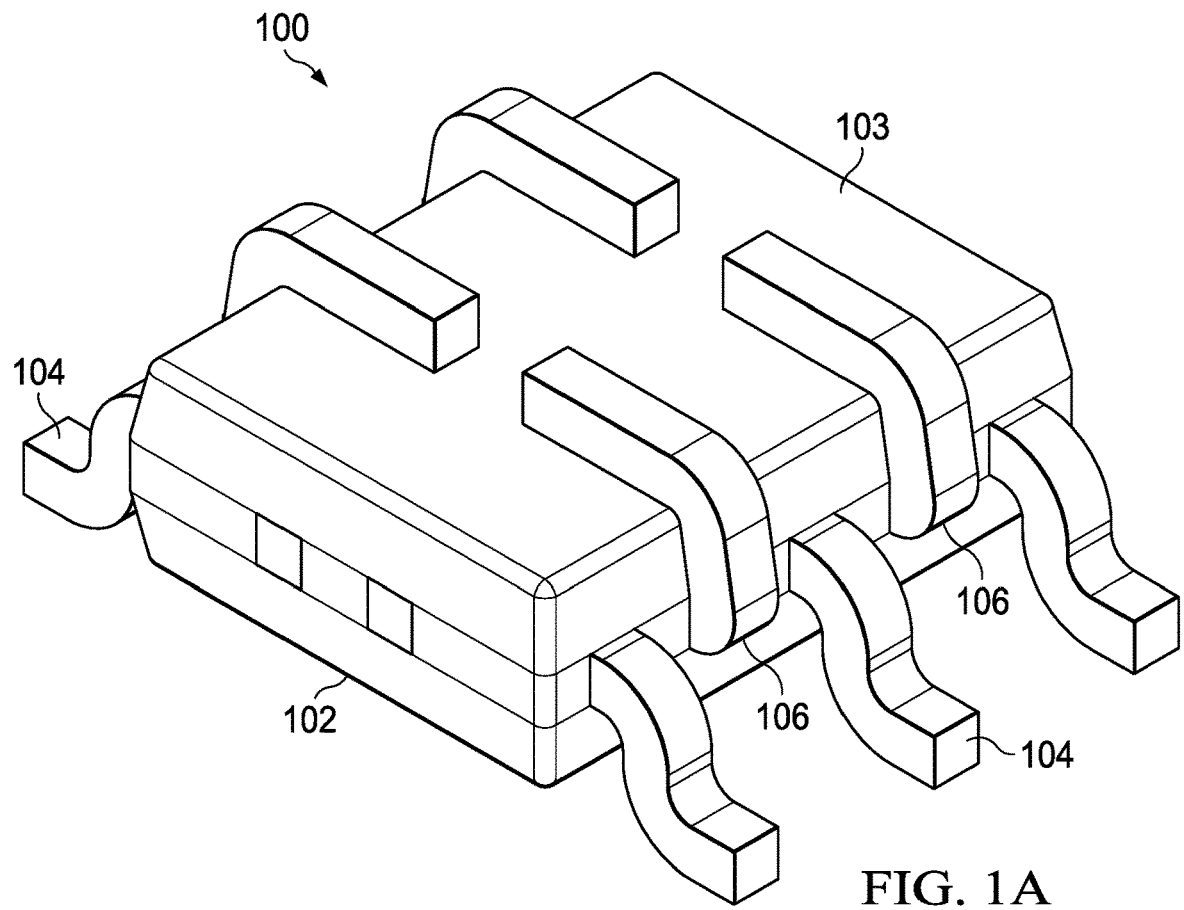
FIG. 1A is a perspective view of a semiconductor package having leads on a topmost surface, in accordance with various examples.

FIG. 1A is a perspective view of a semiconductor package 100 having leads on a topmost surface, in accordance with various examples. The semiconductor package 100 is depicted as a gullwing-lead style package (e.g., a dual inline package (DIP), a small outline package (SOP), a small outline integrated circuit (SOIC) package, a small outline transistor (SOT) package), although the techniques and structures described herein may be extended to other types of packages. The package 100 includes a mold compound 102, a topmost surface 103, and multiple gullwing style leads 104. The topmost surface 103 is the topmost, horizontal, exterior surface of the package 100. Gullwing style leads 104 are leads that are formed in the traditional gullwing shape, i.e., extending horizontally out of the mold compound 102 and including a shoulder that extends a medial segment of the lead 104 in an outward and downward direction and a foot in which a distal segment of the lead 104 is approximately parallel to a plane in which the topmost surface 103 lies. A distal segment of a lead or a conductive member is a continuous portion of that lead or conductive member that includes the distal end of that lead or conductive member.

The package 100 also includes multiple conductive members 106. The conductive members 106 are leads that extend horizontally out of the mold compound 102, but instead of having the traditional gullwing shape, the conductive members 106 extend upward toward the topmost surface 103 and then medially and abutting the topmost surface 103. As is described below, in some examples, a conductive member may continuously abut one or more surfaces of the mold compound 102 along the entire length of the conductive member. In some examples, a conductive member may abut one or more surfaces of the mold compound 102 at one or more points, but not continuously along the entire length of the conductive member. In some examples, the conductive member does not extend horizontally out of the mold compound 102, but instead is exposed to the topmost surface 103 from within the mold compound 102 and is coupled to leads (e.g., leads 104) inside the package 100. By using any of these techniques to position one or more conductive members above the horizontal plane of the topmost surface 103 and in vertical alignment with at least some portion of the package 100, circuit components (e.g., passive components such as inductors, resistors, and capacitors) that would otherwise occupy space within the package 100 may be positioned on the topmost surface 103, thereby preserving space within the package 100 and reducing costs.

Figure 1B:
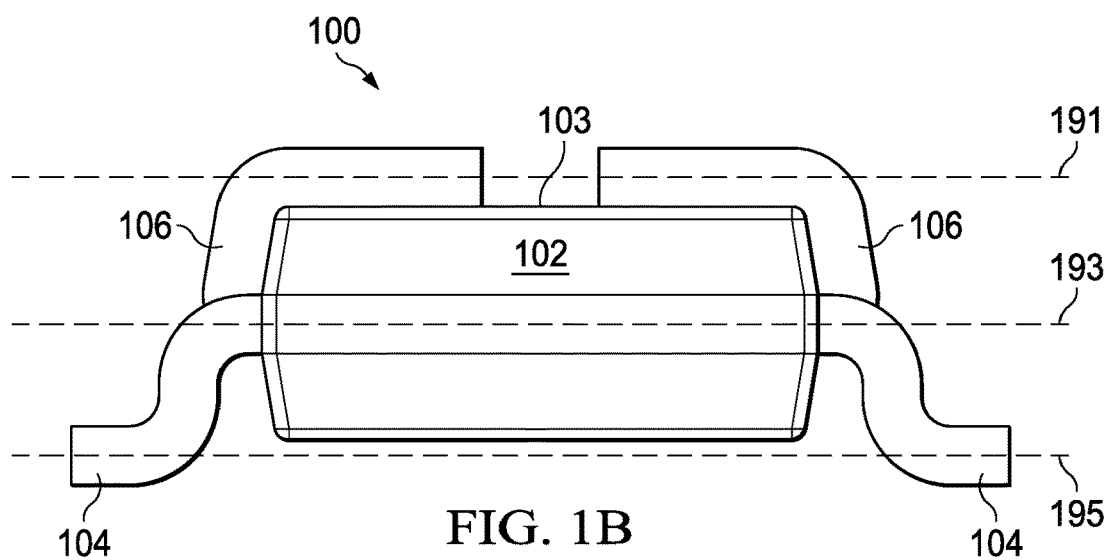
FIG. 1B is a profile view of a semiconductor package having leads on a topmost surface, in accordance with various examples.
Figure 1C:
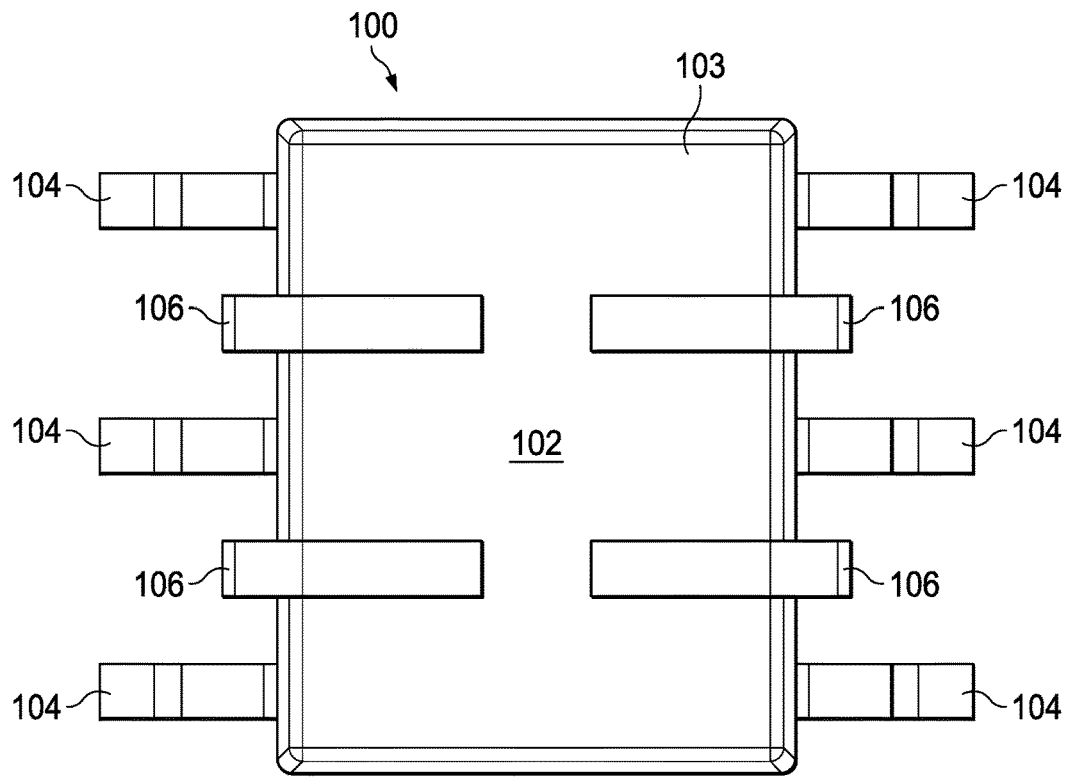
FIG. 1C is a top-down view of a semiconductor package having leads on a topmost surface, in accordance with various examples.
Figure 1D:
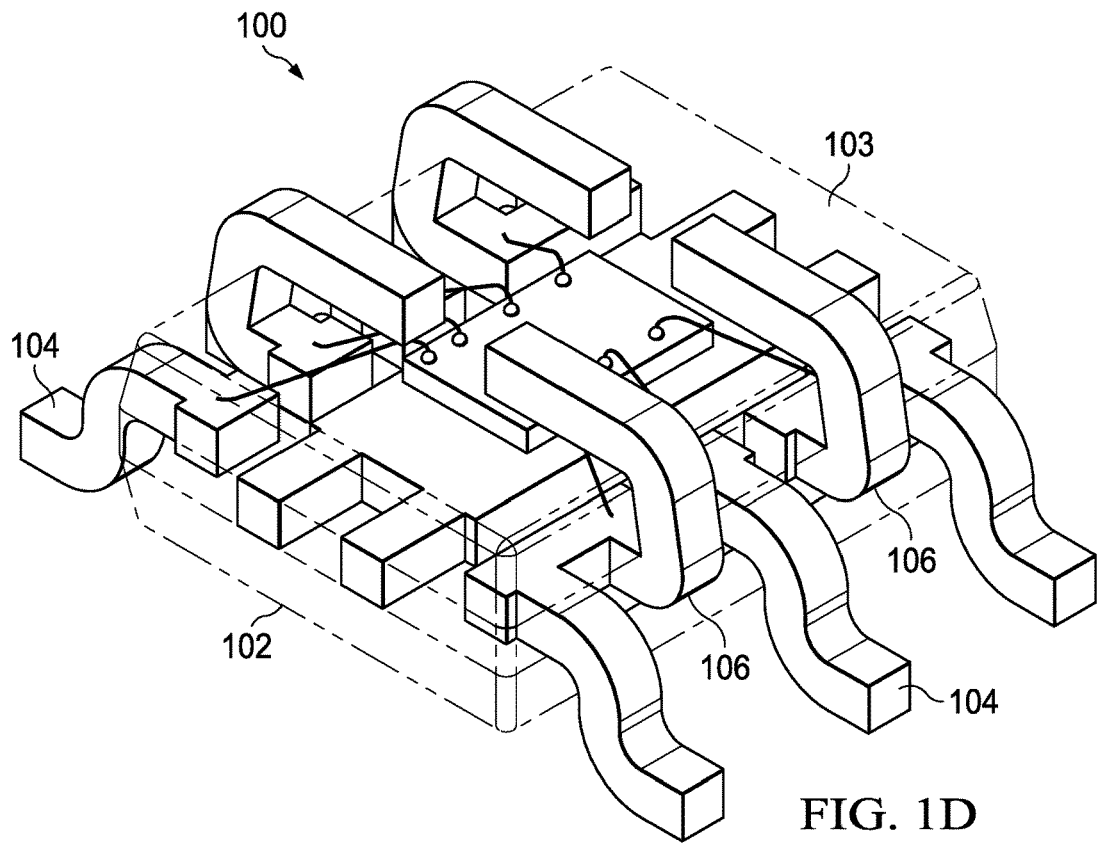
FIG. 1D is a perspective, transparent view of a semiconductor package having leads on a topmost surface, in accordance with various examples.

FIG. 1B is a profile view of the package 100, in accordance with various examples. As shown, a lead 104 emerges from the mold compound 102 in a first horizontal plane 193, and the lead 104 extends downward and outward such that the foot of the lead 104 and/or a distal end of the lead 104 is coincident with (i.e., occurring together in at least one point in three-dimensional space) a second horizontal plane 195 that is lower than a bottom surface of the mold compound 102. The distal end of the lead 104 is not vertically coincident with the mold compound 102. The conductive members 106 emerge from the mold compound 102 in the first horizontal plane 193, and they extend medially and upward to the topmost surface 103 and are coincident with a third horizontal plane 191 that is above the first and second horizontal planes 193, 195 and above the topmost surface 103. The distal ends of the conductive members 106 are vertically coincident with the mold compound 102. FIG. 1C is a top-down view of the package 100, in accordance with various examples. FIG. 1D is a perspective, transparent view of the package 100, in accordance with various examples. FIG. 1D shows only a subset of the components inside the package 100, sufficient to demonstrate that leads 104 and conductive members 106 extend inward within the package 100 and form a network of connections as may be suitable to implement one or more functions (e.g., a direct current (DC) to DC power converter).

Figure 2A:
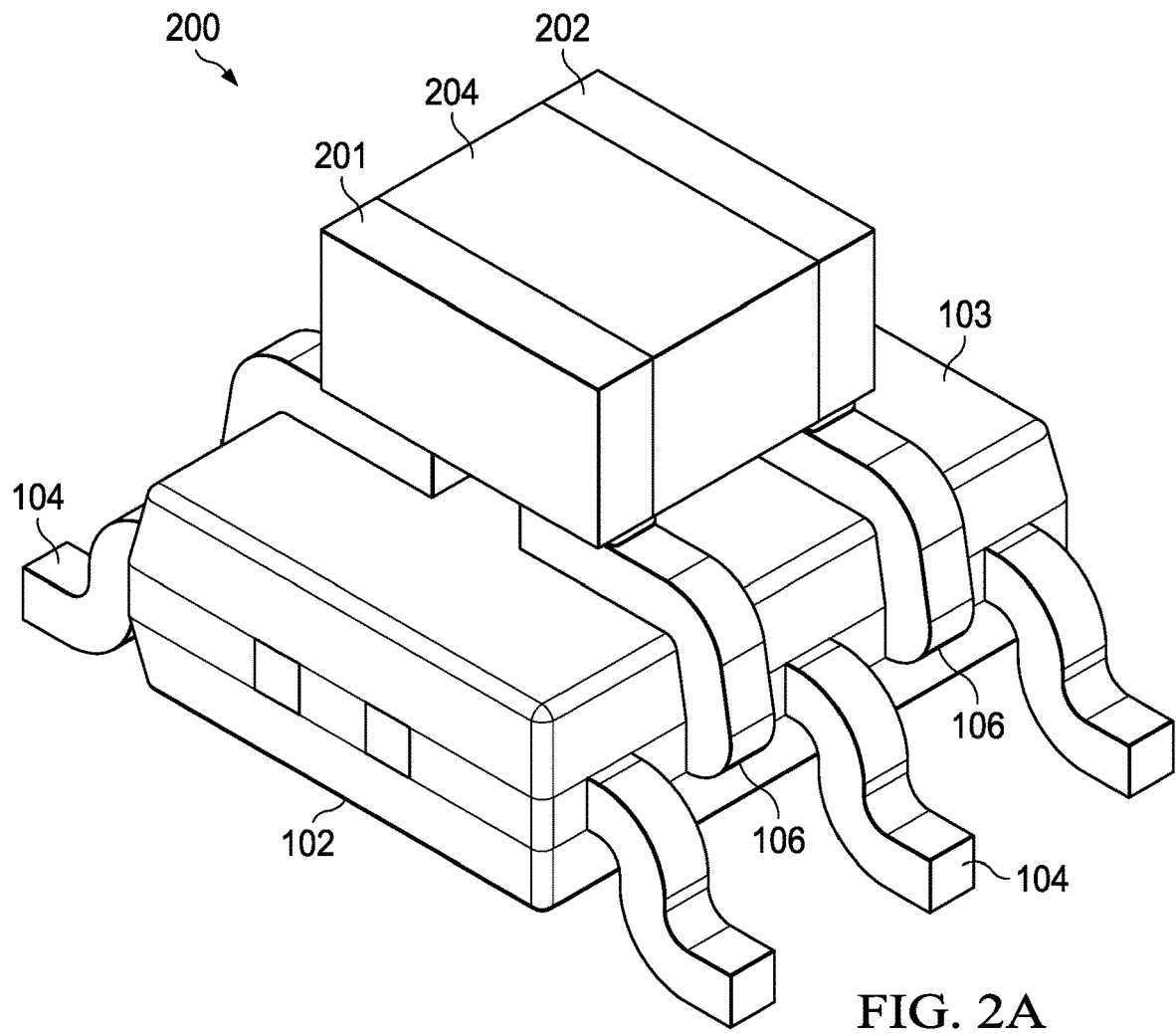
FIG. 2A is a perspective view of a semiconductor package having leads coupled to a passive component on a topmost surface, in accordance with various examples.

FIG. 2A is a perspective view of a semiconductor package 200 having leads coupled to a passive component on a topmost surface, in accordance with various examples. The structure of package 200 is identical to that of package 100, except that package 200 has coupled thereto on the topmost surface 103 an inductor 204 having terminals 201 and 202. The inductor 204 is illustrative, and other components (e.g., passive components) may be coupled to the topmost surface 103 in addition to or instead of the inductor 204. The terminal 201 is coupled to a pair of conductive members 106, and the terminal 202 is coupled to another pair of conductive members 106. In examples, the pair of conductive members 106 coupled to the terminal 201 are coupled to each other inside the package 200, and they may further be coupled to other structures that form a network of connections within the package 200 to implement a particular function (e.g., DC-DC converter). Similarly, in examples, the pair of conductive members 106 coupled to the terminal 202 are coupled to each other inside the package 200, and they may further be coupled to other structures that form a network of connections within the package 200 to implement a particular function (e.g., DC-DC converter).

Figure 2B:
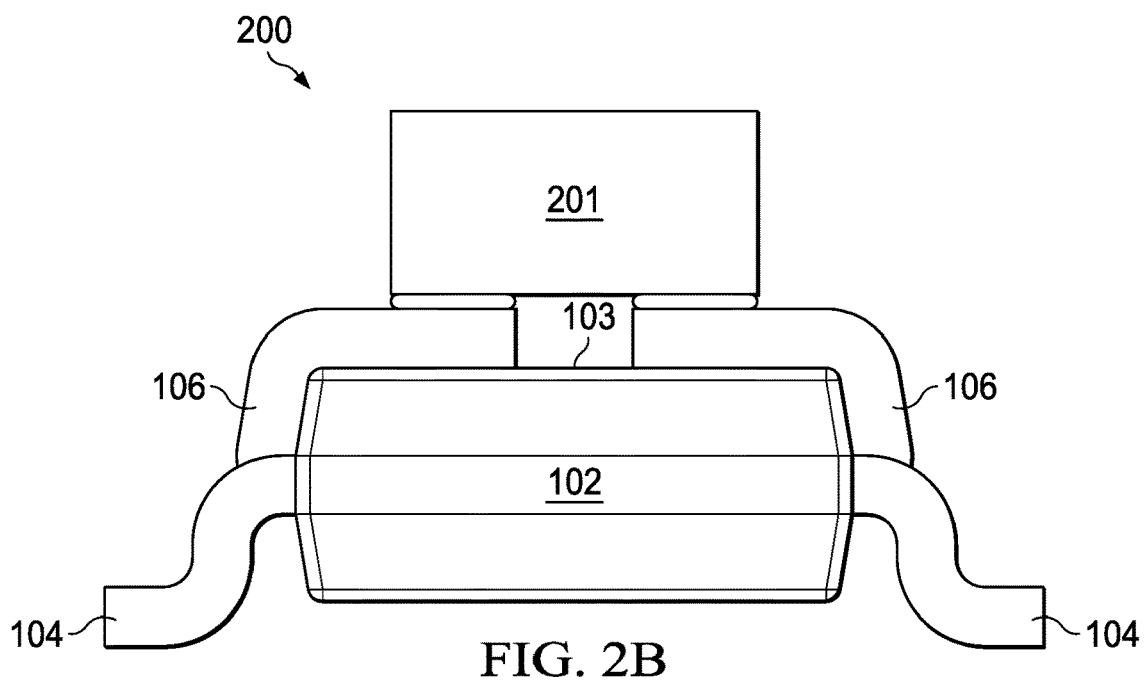
FIG. 2B is a profile view of a semiconductor package having leads coupled to a passive component on a topmost surface, in accordance with various examples.
Figure 2C:
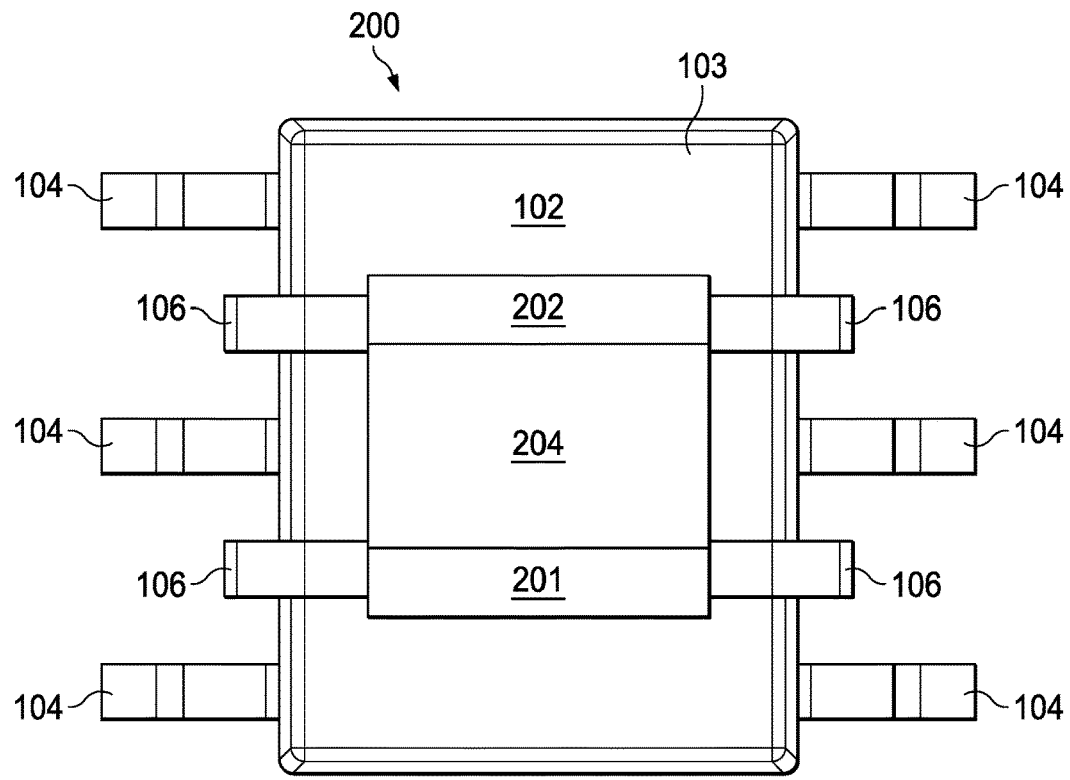
FIG. 2C is a top-down view of a semiconductor package having leads coupled to a passive component on a topmost surface, in accordance with various examples.

FIG. 2B is a profile view of the package 200, in accordance with various examples. The conductive members 106 extend across and abut the topmost surface 103 for a sufficient length so as to make adequate contact with the terminals 201, 202 such that the operation of the package 200 and the inductor 204 is not impeded. FIG. 2C is a top-down view of the package 200, in accordance with various examples.

Figure 2D:
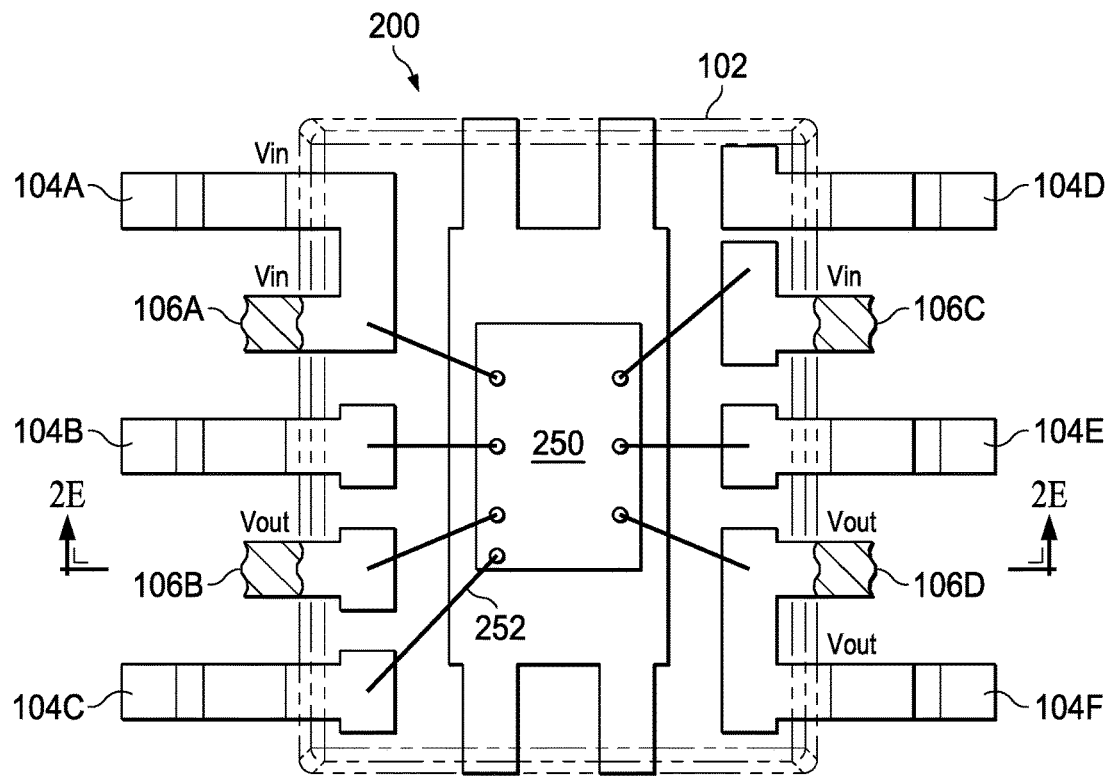
FIG. 2D is a top-down view of an interior of a semiconductor package having leads coupled to a passive component on a topmost surface, in accordance with various examples.
Figure 2E:
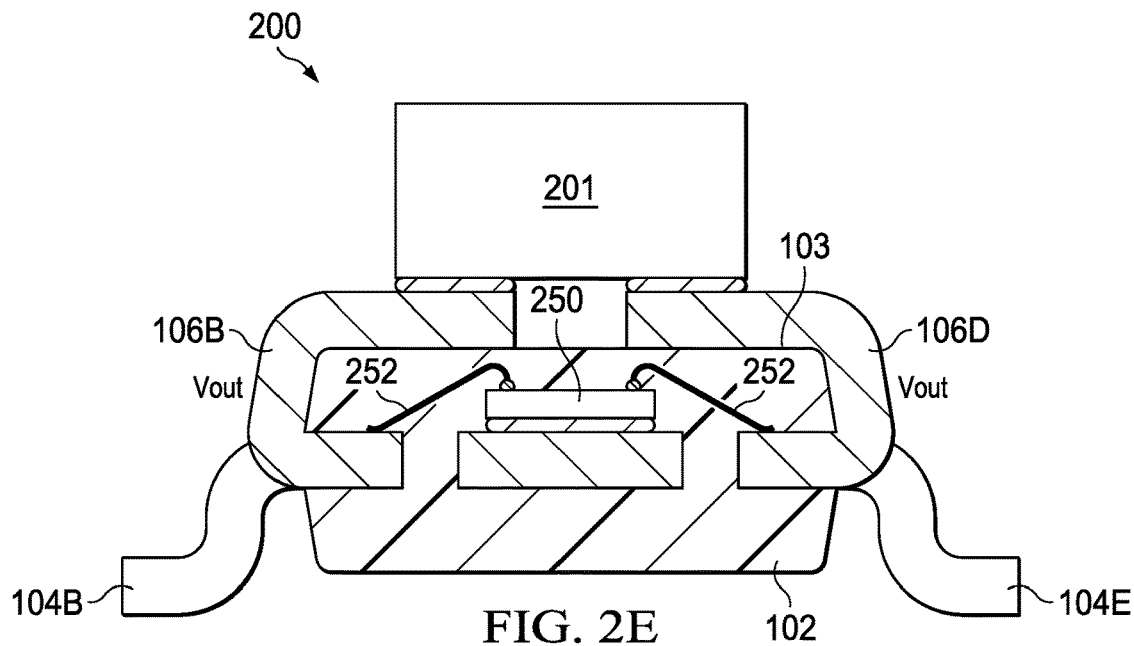
FIG. 2E is a cross-sectional view of a semiconductor package having leads coupled to a passive component on a topmost surface, in accordance with various examples.
Figure 2F:
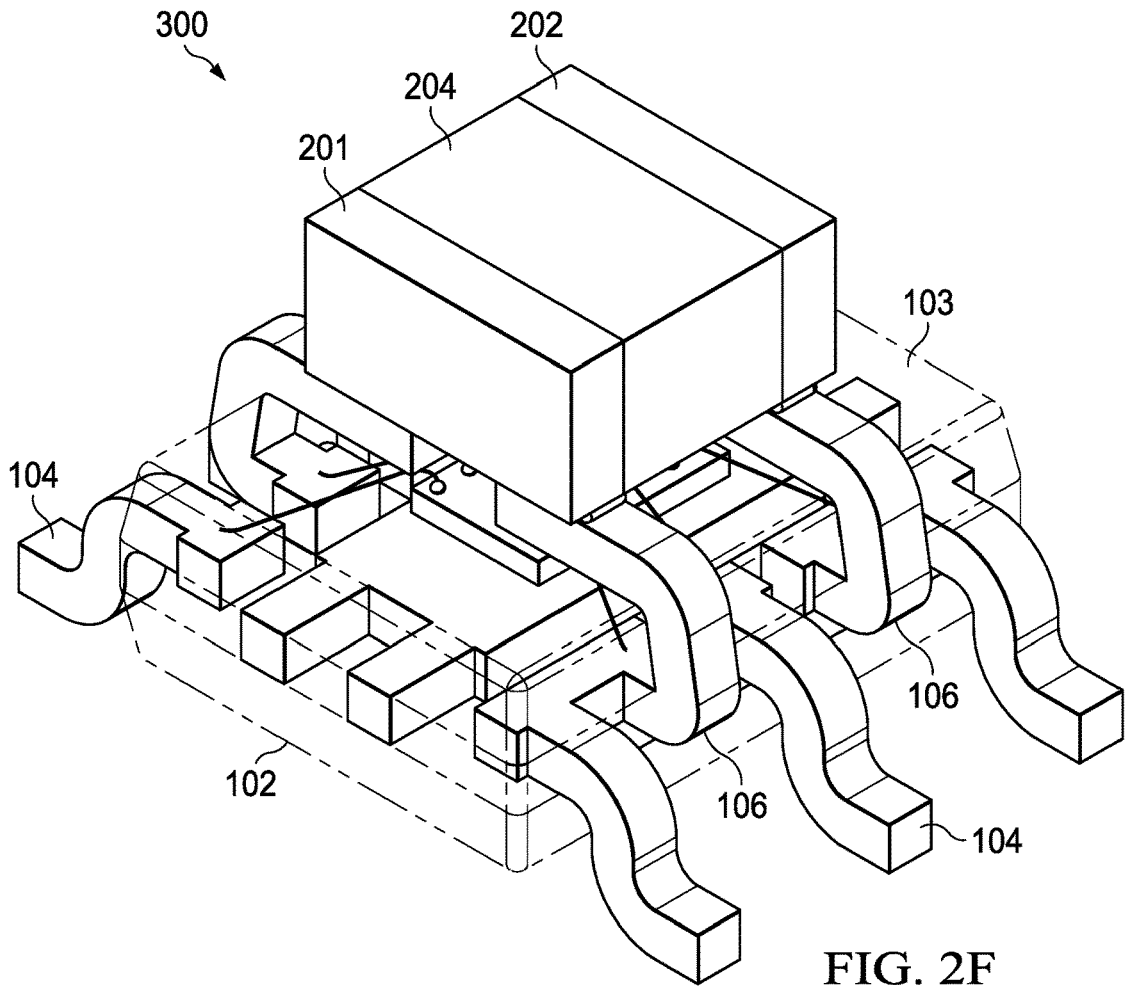
FIG. 2F is a perspective, transparent view of a semiconductor package having leads coupled to a passive component on a topmost surface, in accordance with various examples.

FIG. 2D is a top-down view of an interior of the package 200, in accordance with various examples. The interior of the package 200 may include a semiconductor die 250 that is coupled to various leads 104A, 104B, 104C, 104D, 104E, and 104F by way of bond wires 252. Similarly, the semiconductor die 250 may be coupled to various conductive members 106A, 106B, 106C, and 106D by way of bond wires 252. As shown, various ones of the leads 104A-104F and conductive members 106A-106D are coupled to each other to form a network of connections within the package 200. For example, lead 104A is coupled to conductive member 106A, and together they form a Vin (voltage input) node for the package 200. Similarly, lead 104F and conductive member 106D are coupled to each other and form a Vout (voltage output) node for the package 200. The conductive member 106B may be part of the Vout node, and the conductive member 106C may be a part of the Vin node. Thus, referring to FIGS. 2A and 2D simultaneously, the terminal 202 of the inductor 204 is coupled to conductive members 106A and 106C to form the Vin node, which also is coupled to the lead 104A. In this way, the terminal 202 is coupled to the lead 104A, thereby providing electrical pathways between the terminal 202, the interior of the package 200 (e.g., the semiconductor die 250), and the printed circuit board (PCB) on which the package 200 may be mounted. Similarly, the terminal 201 of the inductor 204 may be coupled to conductive members 106B and 106D, and because conductive member 106D is also coupled to lead 104F, an electrical pathway is provided between the terminal 201, the interior of the package 200, and the PCB to which the package 200 may be coupled. FIG. 2E is a profile, cross-sectional view of the package 200 along the conductive members 106B, 106D of FIG. 2D. FIG. 2F is a perspective, transparent view of the package 200, in accordance with various examples. The structure shown in FIG. 2F is identical to that shown in FIG. 2A, but with visibility into a subset of the structures within the package 200.

Figure 3A:
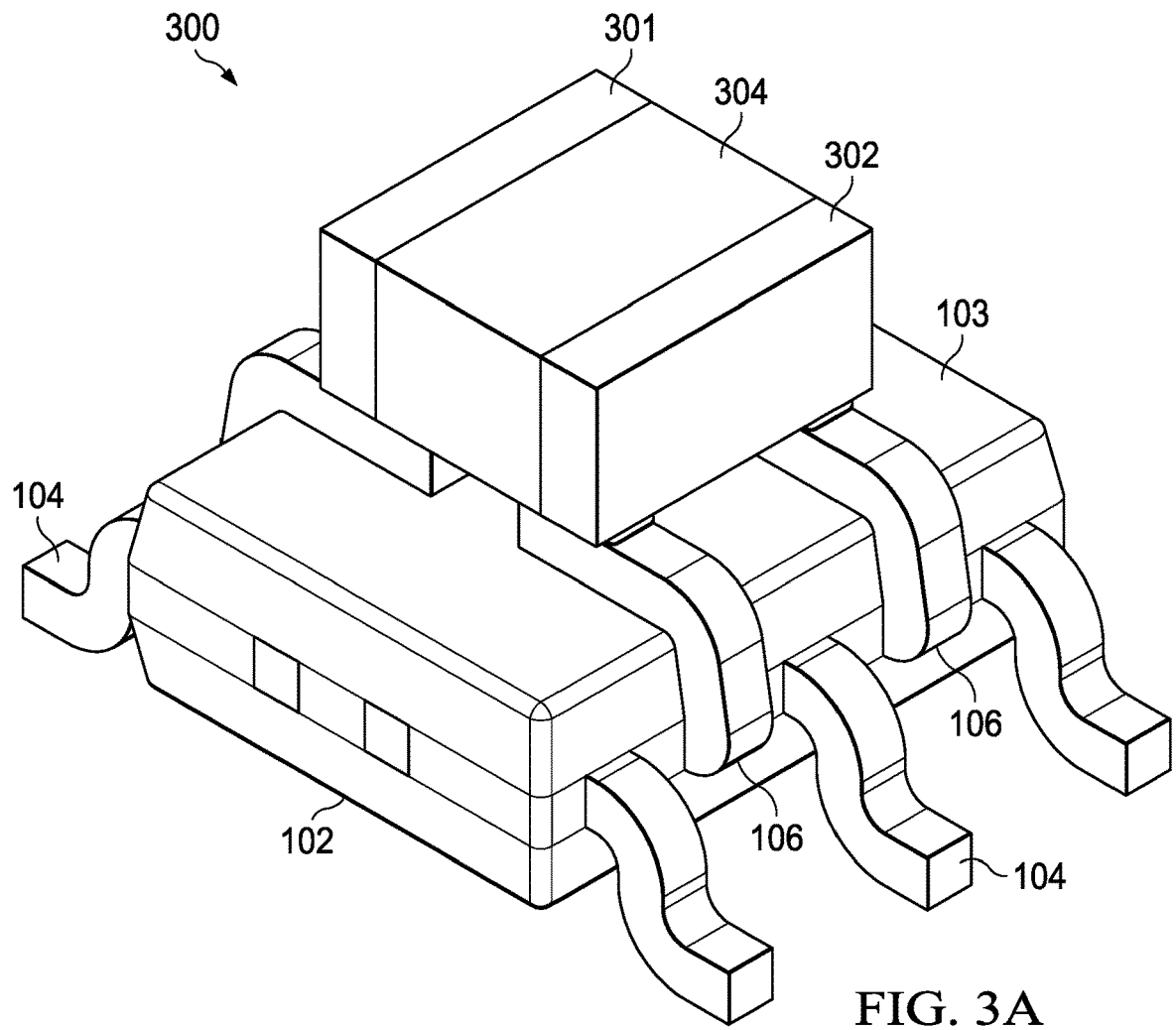
FIG. 3A is a perspective view of a semiconductor package having leads coupled to a passive component on a topmost surface, in accordance with various examples.
Figure 3B:
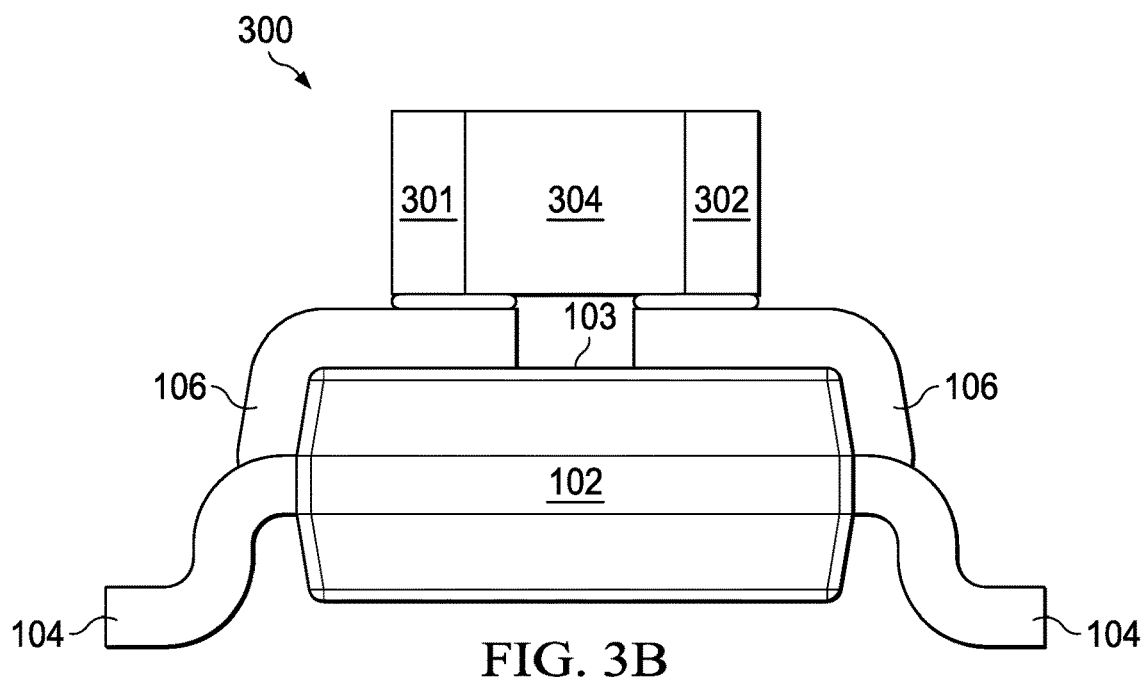
FIG. 3B is a profile view of a semiconductor package having leads coupled to a passive component on a topmost surface, in accordance with various examples.
Figure 3C:
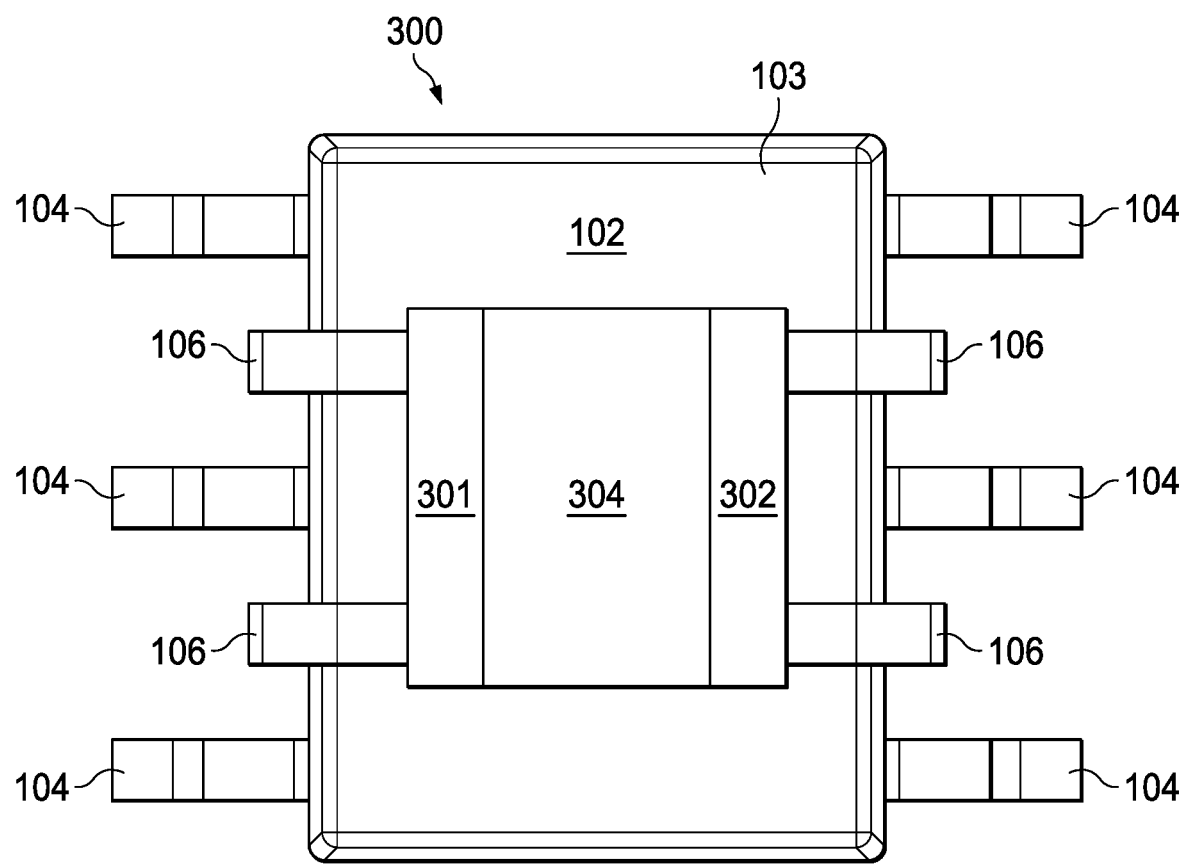
FIG. 3C is a top-down view of a semiconductor package having leads coupled to a passive component on a topmost surface, in accordance with various examples.
Figure 3D:
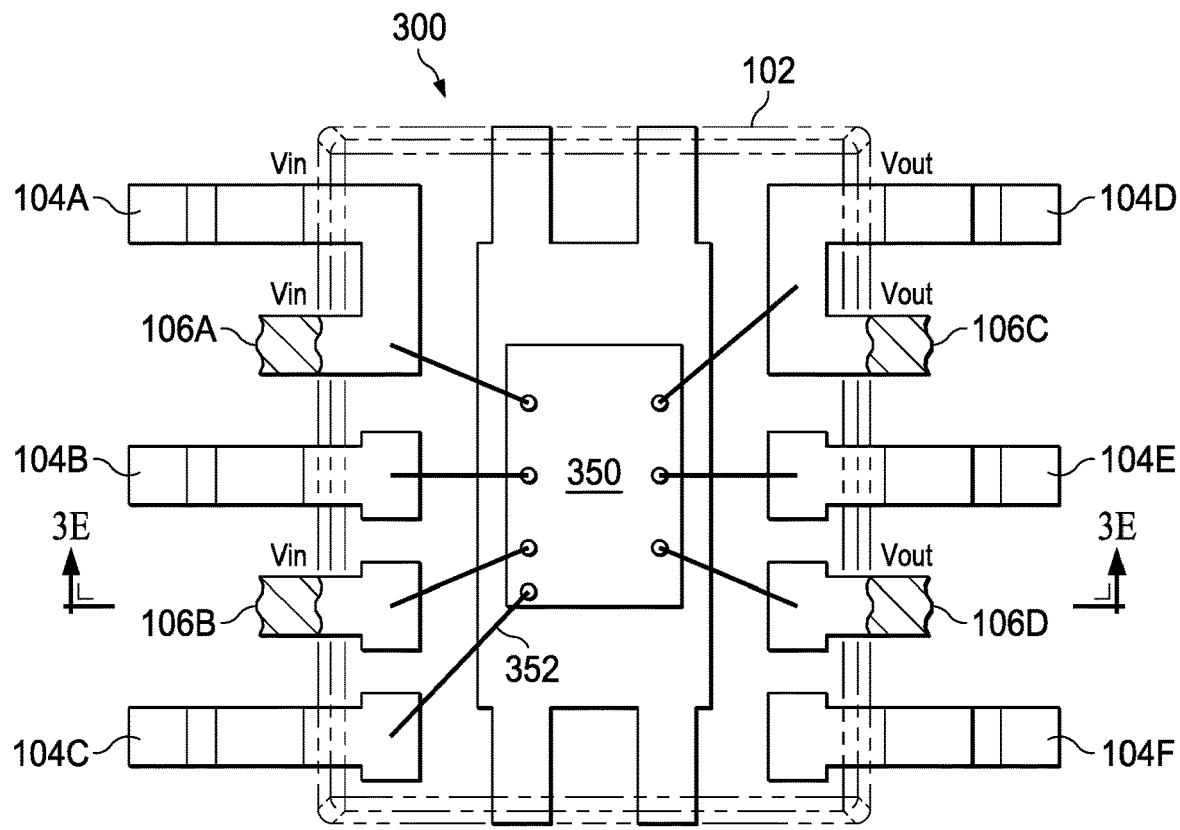
FIG. 3D is a top-down view of an interior of a semiconductor package having leads on a topmost surface, in accordance with various examples.
Figure 3E:
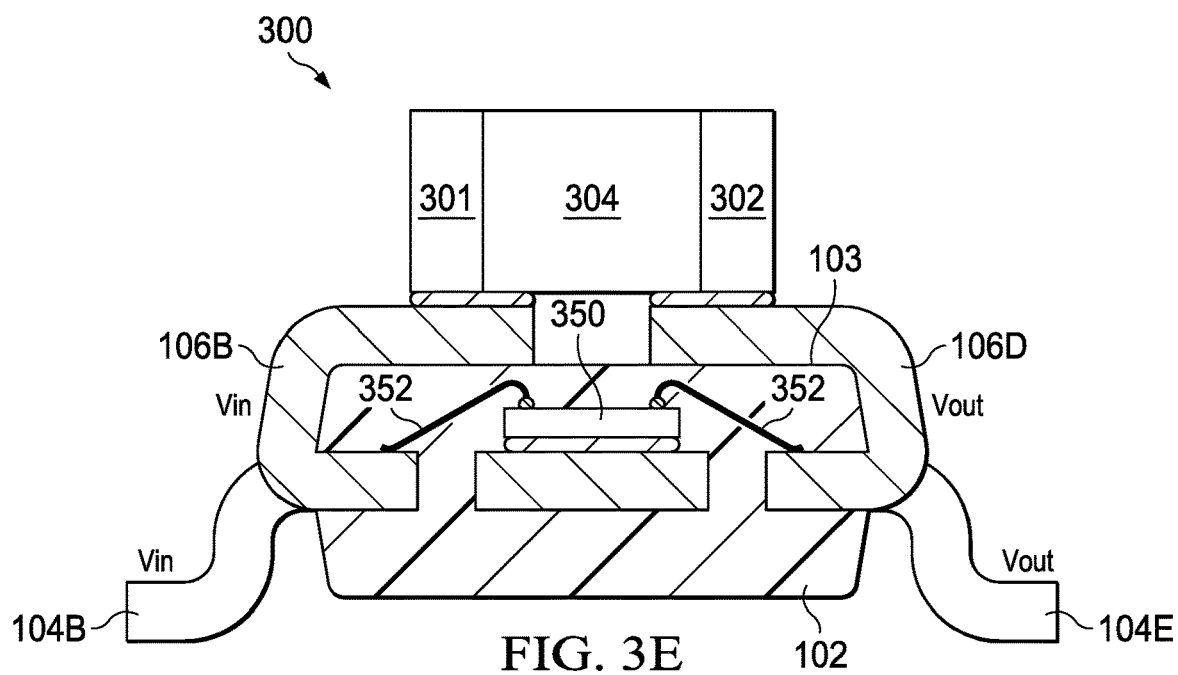
FIG. 3E is a cross-sectional view of a semiconductor package having leads on a topmost surface, in accordance with various examples.

FIG. 3A is a perspective view of a semiconductor package 300 having leads coupled to a passive component on a topmost surface, in accordance with various examples. The package 300 is identical to the package 200, except that the orientation of an inductor 304 is rotated relative to the orientation of the inductor 204 and, consequently, the configuration of the leads 104 and the conductive members 106 is different than that shown in FIG. 2D. Referring simultaneously to FIGS. 3A and 3D, the inductor 304 includes terminals 301 and 302. Terminal 301 is coupled to the conductive members 106A and 106B. Because terminal 301 is coupled to both of these conductive members 106A and 106B, the three of them together form a Vin (input voltage) node. Lead 104A is also coupled to the conductive member 106A. Thus, an electrical pathway is provided between the terminal 301, the interior of the package 300 (e.g., a semiconductor die 350 coupled to the network of connections formed at least in part by the leads 104A-104F and conductive members 106A-106D by bond wires 352), and a PCB on which the package 300 is mounted. Similarly, the terminal 302 is coupled to the conductive members 106C and 106D. Because terminal 302 is coupled to both of these conductive members 106C and 106D, the three of them together form a Vout (output voltage) node. Lead 104D is also coupled to the conductive member 106C. Thus, an electrical pathway is provided between the terminal 302, the interior of the package 300, and the PCB on which the package 300 is mounted. FIG. 3B is a profile view of the package 300, in accordance with various examples. FIG. 3C is a top-down view of the package 300, in accordance with various examples. FIG. 3E is a cross-sectional view of the package 300 along the conductive members 106B, 106D, in accordance with various examples.

Figure 4A:
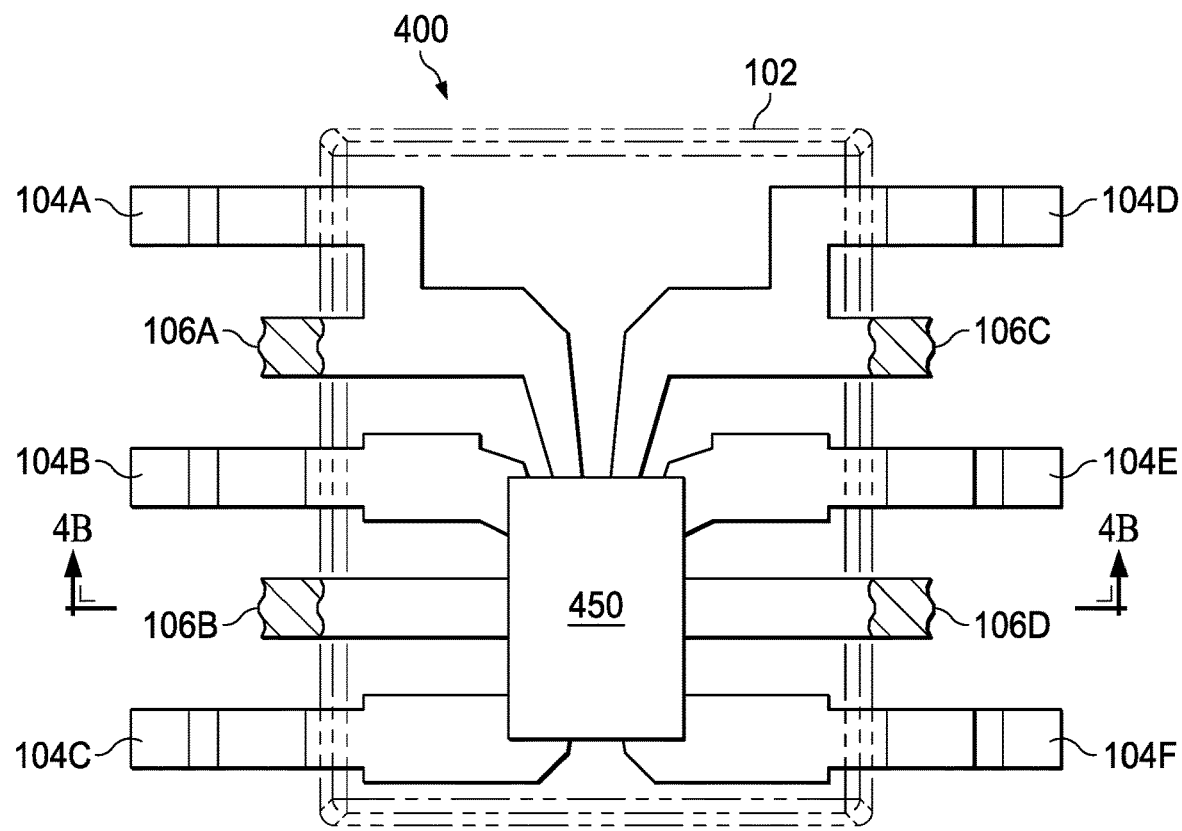
FIG. 4A is a top-down view of an interior of a semiconductor package having leads on a topmost surface, in accordance with various examples.
Figure 4B:
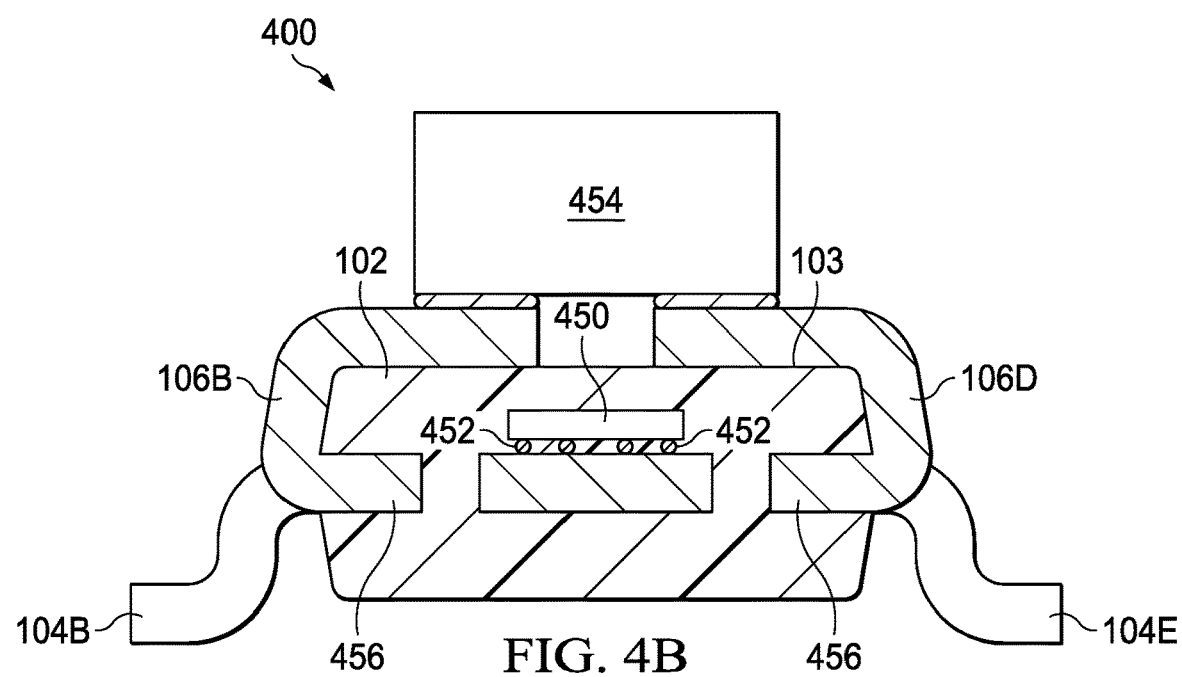
FIG. 4B is a cross-sectional view of a semiconductor package having leads on a topmost surface, in accordance with various examples.

As described above, a package (e.g., packages 100, 200, 300) described herein may include bond wires to establish connections between a semiconductor die and various conductive members and leads. However, in some examples, conductive bumps may replace bond wires. FIG. 4A is a top-down view of an interior of a semiconductor package 400 having leads on a topmost surface, in accordance with various examples. The package 400 includes a semiconductor die 450 that is coupled to the various leads 104A-F and conductive members 106A-D using conductive bumps (e.g., solder bumps). In package 400, the semiconductor die 450 is positioned above the leads 104A-F and conductive members 106A-D, with a device side of the semiconductor die 450 facing downward toward the leads 104A-F and the conductive members 106A-D. FIG. 4B is a cross-sectional view of the package 400, showing the semiconductor die 450 coupled to conductive structures 456 by way of conductive bumps 452, where the structures 456 may include a lead 104, a conductive member 106, or a combination thereof. A passive component 454, such as an inductor, is coupled to conductive members 106 on a topmost surface of the package 400.

Figure 5A:
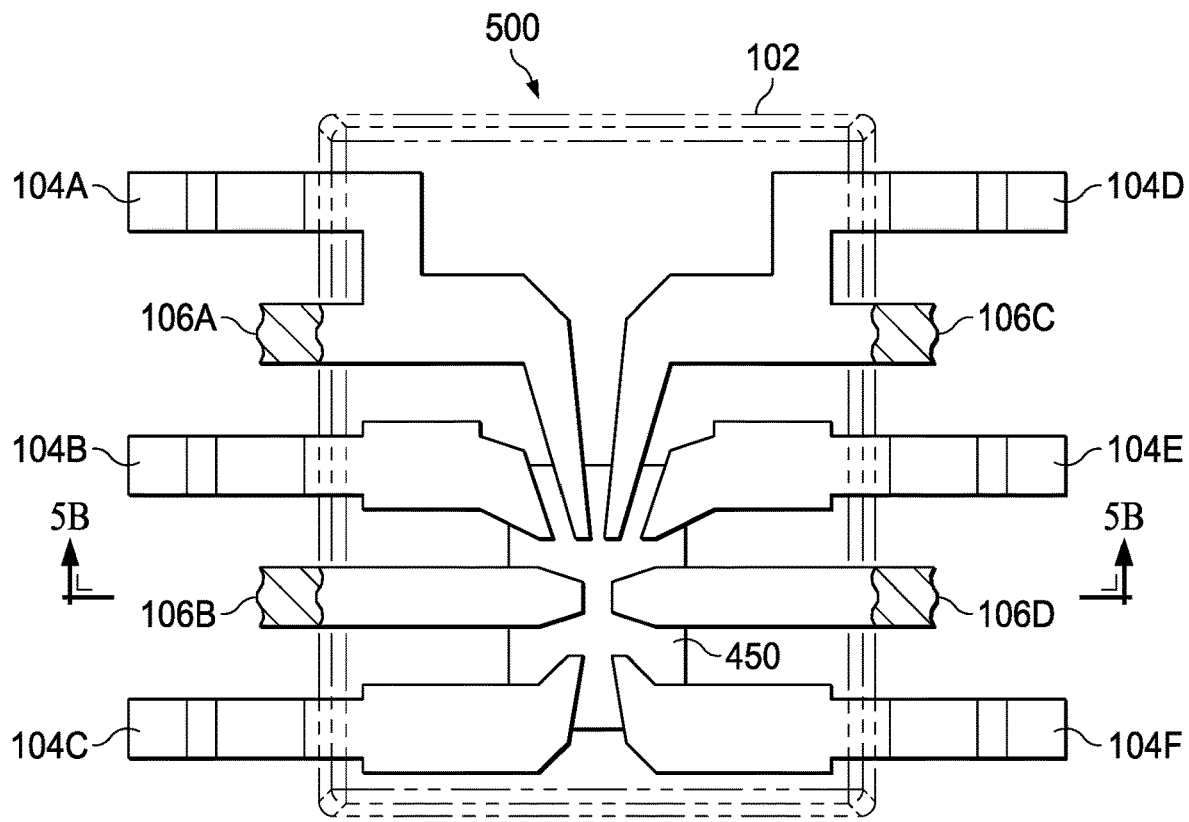
FIG. 5A is a top-down view of an interior of a semiconductor package having leads on a topmost surface, in accordance with various examples.
Figure 5B:
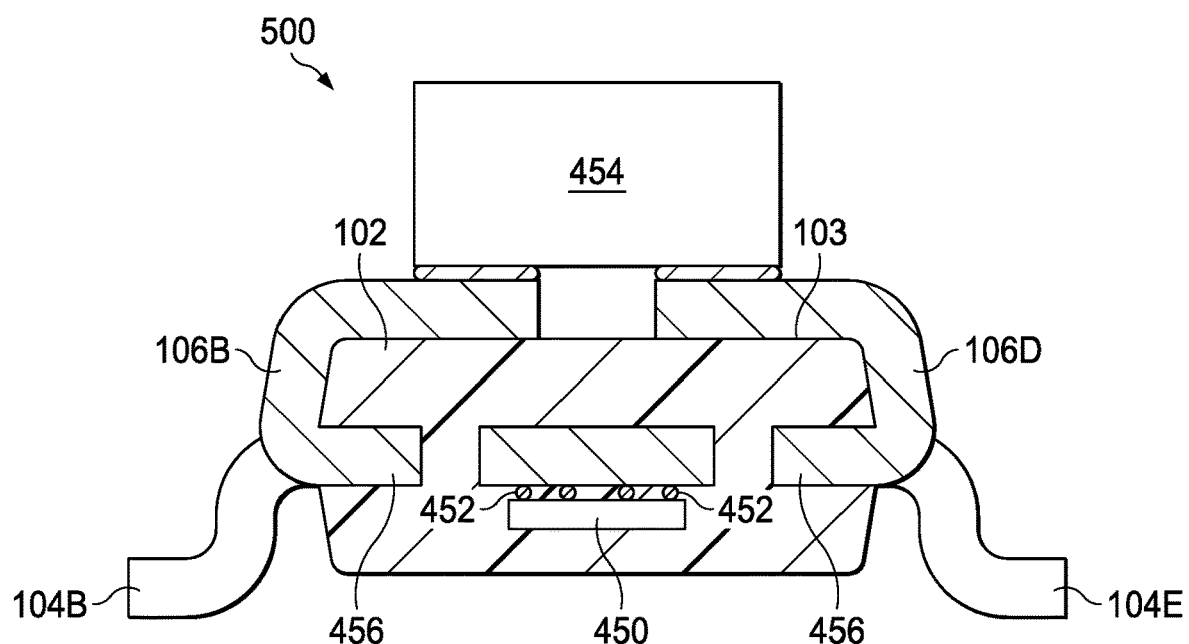
FIG. 5B is a cross-sectional view of a semiconductor package having leads on a topmost surface, in accordance with various examples.

FIG. 5A is a top-down view of an interior of a semiconductor package 500 having leads on a topmost surface, in accordance with various examples. The package 500 shown in FIG. 5A is a variation of the package 400 shown in FIGS. 4A and 4B. More specifically, the package 500 shown in FIG. 5A includes the semiconductor die 450 positioned below the leads 104A-F and conductive members 106A-D and facing upward toward the leads 104A-F and conductive members 106A-D. The device side of the semiconductor die 450 is coupled to the leads 104A-F and conductive members 106A-D through conductive bumps 452, such as solder balls. FIG. 5B is a cross-sectional view of the structure of FIG. 5A, with the conductive bumps 452 coupling the semiconductor die 450 to structures 456, which may include a lead 104, a conductive member 106, or a combination thereof.

Figure 6A:
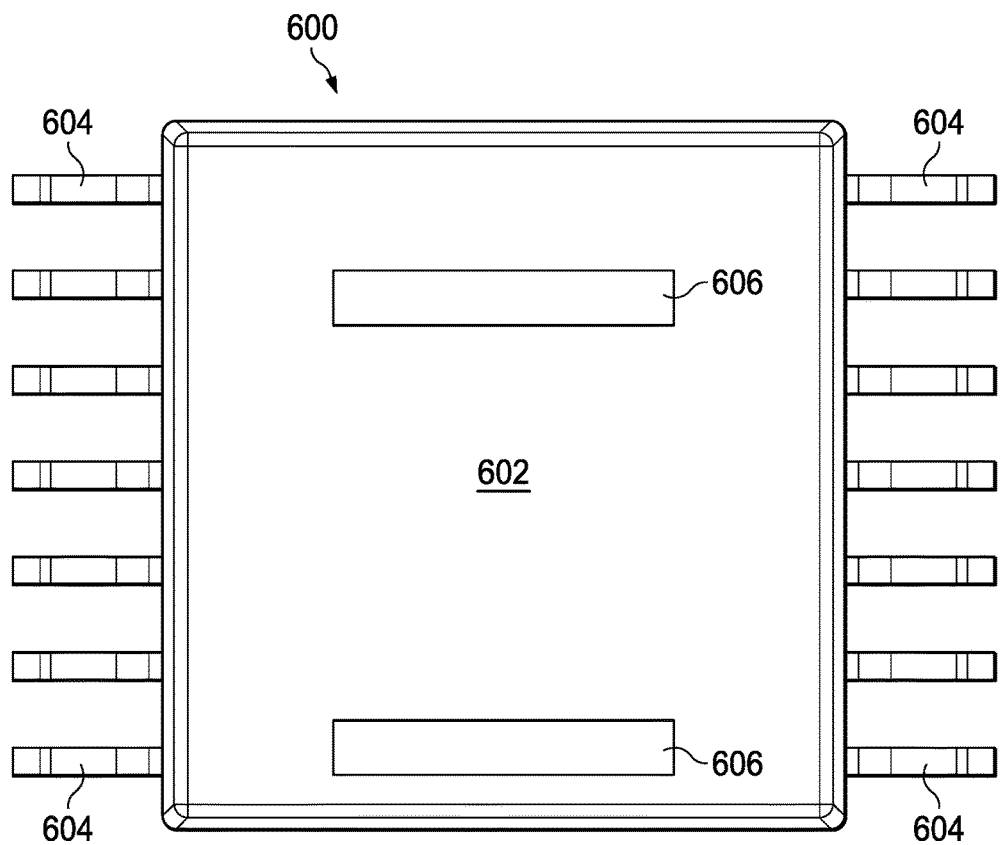
FIG. 6A is a top-down view of a semiconductor package having conductive members on a topmost surface, in accordance with various examples.
Figure 6B:
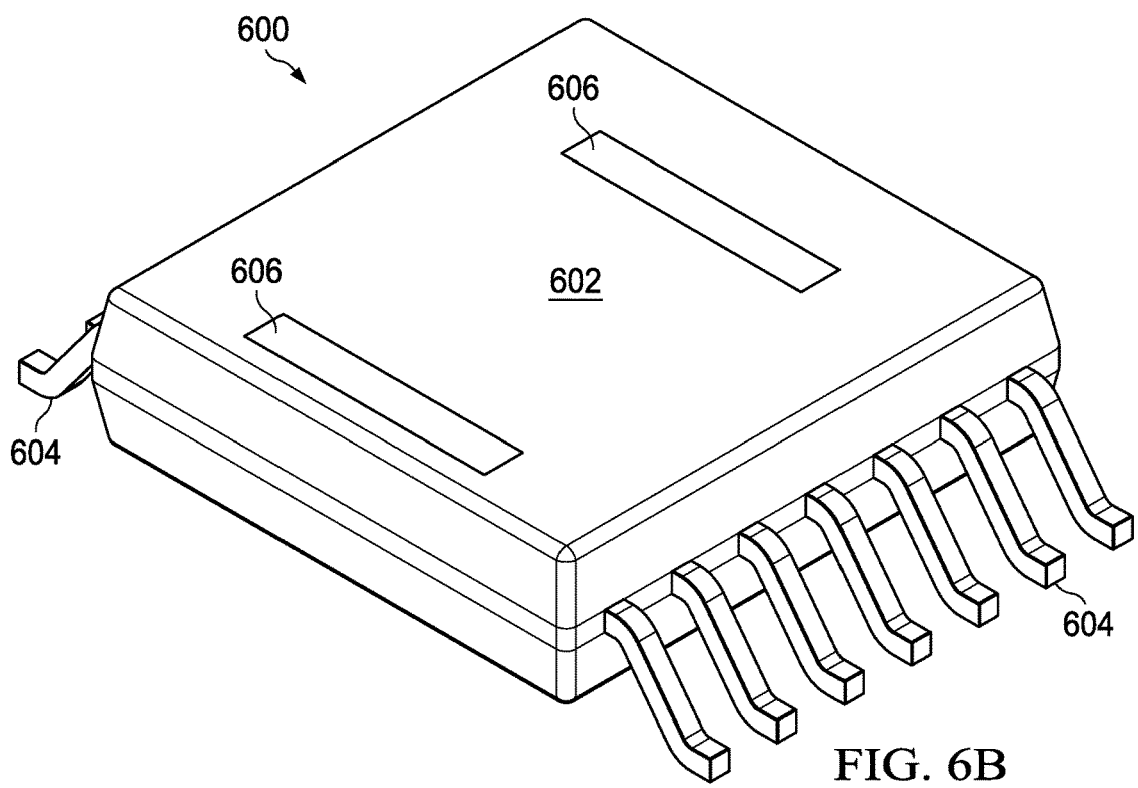
FIG. 6B is a perspective view of a semiconductor package having conductive members on a topmost surface, in accordance with various examples.

As described above, in some examples, a conductive member is exposed to a topmost surface of a semiconductor package from within the package, as opposed to a conductive member (i.e., a lead) that extends outside the package and then upward and medially toward the topmost surface of the package. FIG. 6A is a top-down view of a semiconductor package 600 having conductive members on a topmost surface, in accordance with various examples. More specifically, the package 600 includes a mold compound 602, leads 604, and conductive members 606 that are exposed to the topmost surface of the mold compound 602/package 600 from within the package 600. Stated another way, the conductive members 606 in package 600 are not leads external to the package 600 that have been shaped to extend toward the topmost surface; instead, the conductive members 606 emerge from within the topmost surface itself and are exposed to the topmost surface. FIG. 6B is a perspective view of the package 600, in accordance with various examples. The conductive members 606 are not exposed to a bottom surface of the mold compound 602, where the bottom surface of the mold compound 602 is approximately parallel with the topmost surface of the mold compound 602.

Figure 6C:
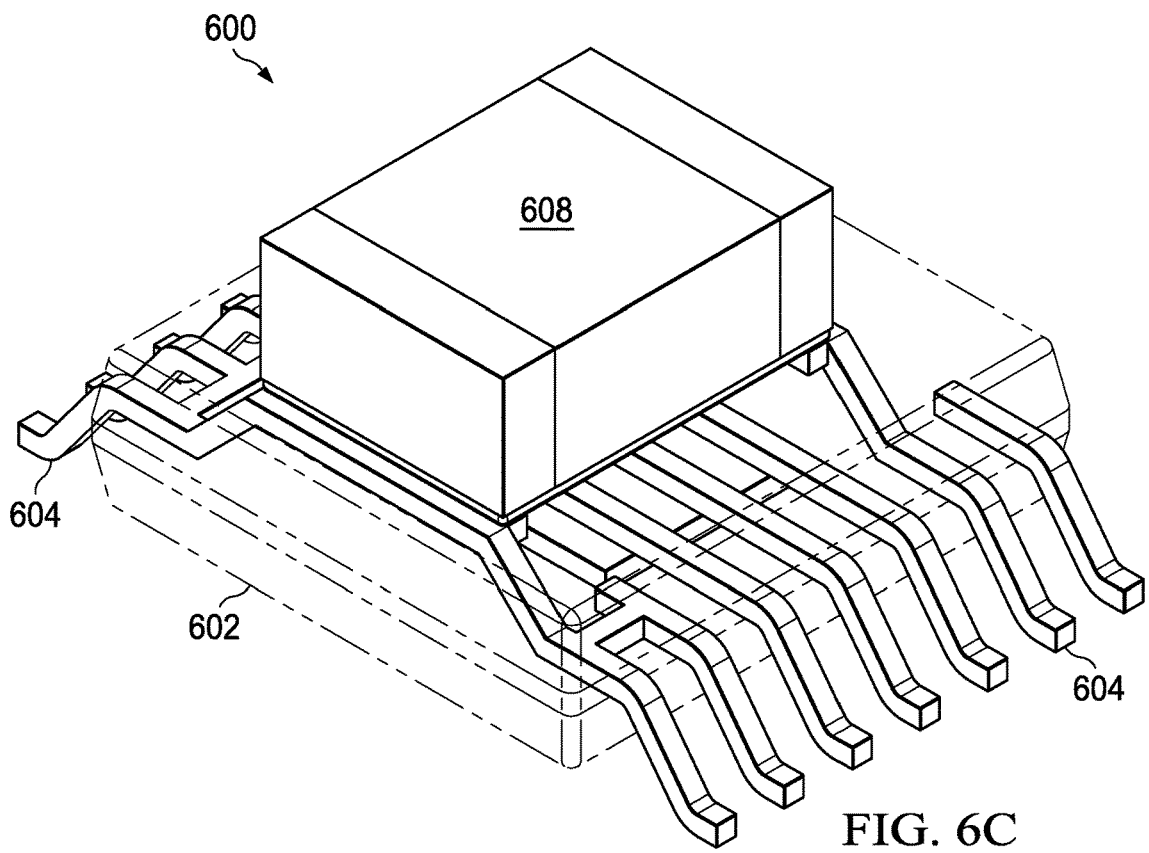
FIG. 6C is a perspective, transparent view of a semiconductor package having conductive members coupled to a passive component on a topmost surface, in accordance with various examples.
Figure 6D:
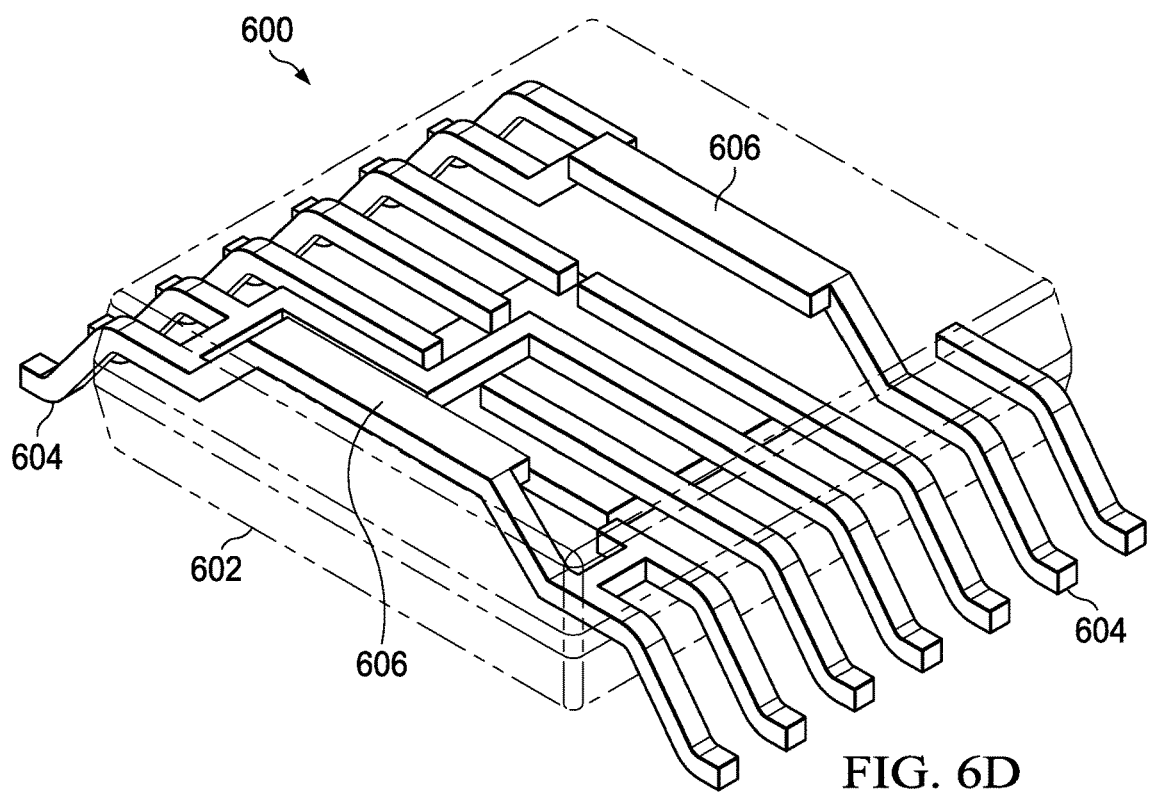
FIG. 6D is a perspective, transparent view of a semiconductor package having conductive members on a topmost surface, in accordance with various examples.
Figure 6E:
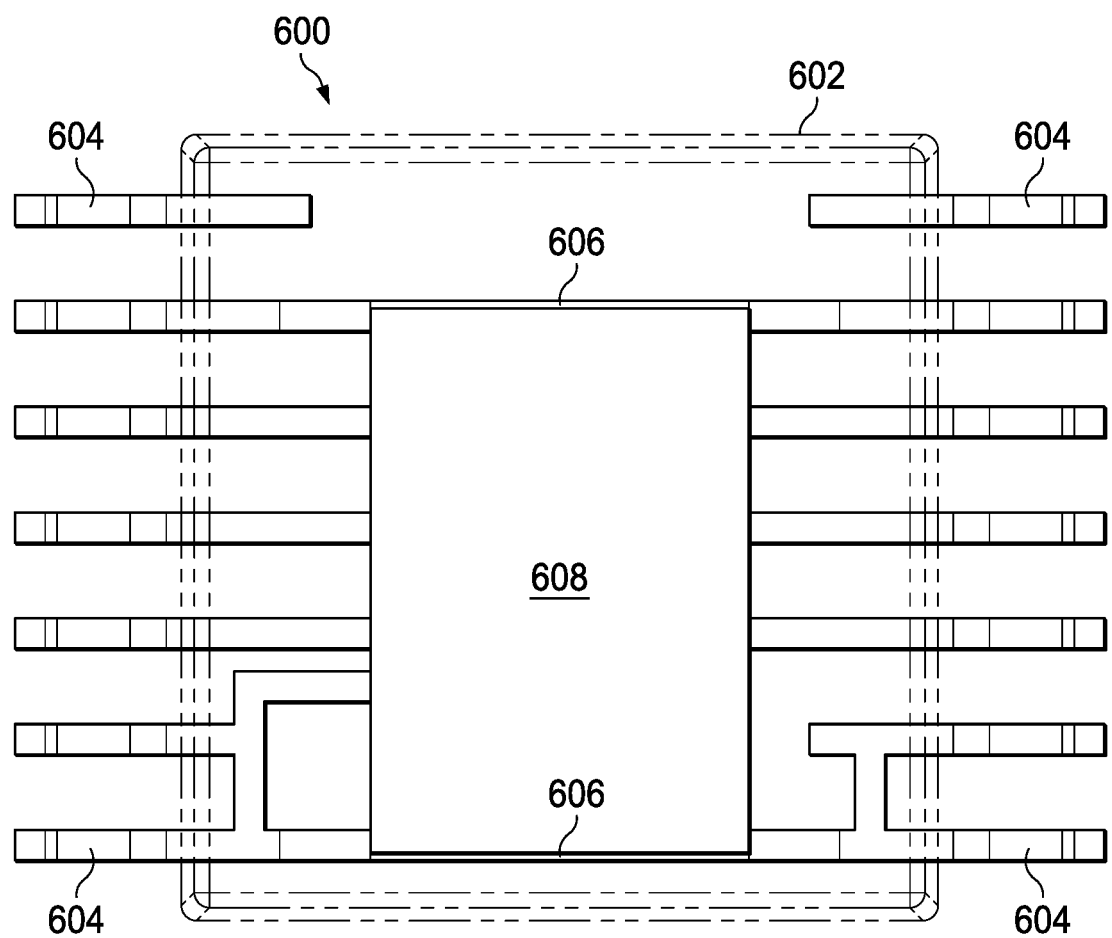
FIG. 6E is a top-down, transparent view of a semiconductor package having conductive members coupled to a passive component on a topmost surface, in accordance with various examples.
Figure 6F:
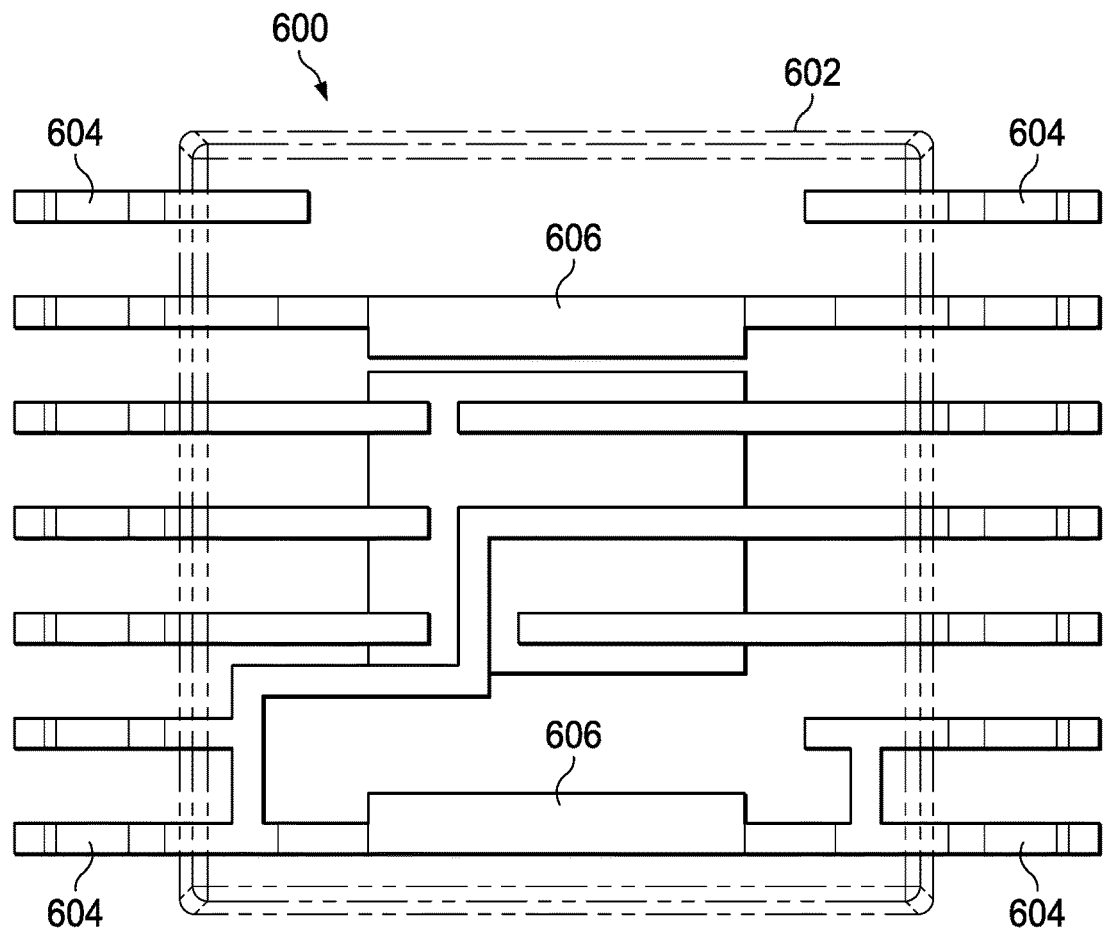
FIG. 6F is a top-down, transparent view of a semiconductor package having conductive members on a topmost surface, in accordance with various examples.

FIG. 6C is a perspective, transparent view of the package 600. The package 600 has coupled thereto a passive component (e.g., inductor) 608. A subset of the components within the package 600 is visible in FIG. 6C. As shown, one or more leads 604 may be coupled to the conductive members 606 inside the package 600. In some examples, a conductive member 606 is coupled to multiple leads 604. FIG. 6D is another perspective, transparent view of the structure of FIG. 6C, except without the passive component 608 coupled thereto. FIG. 6E is a top-down view of the structure of FIG. 6C, in accordance with various examples. FIG. 6F is a top-down view of the structure of FIG. 6D, in accordance with various examples.

Figure 6G:
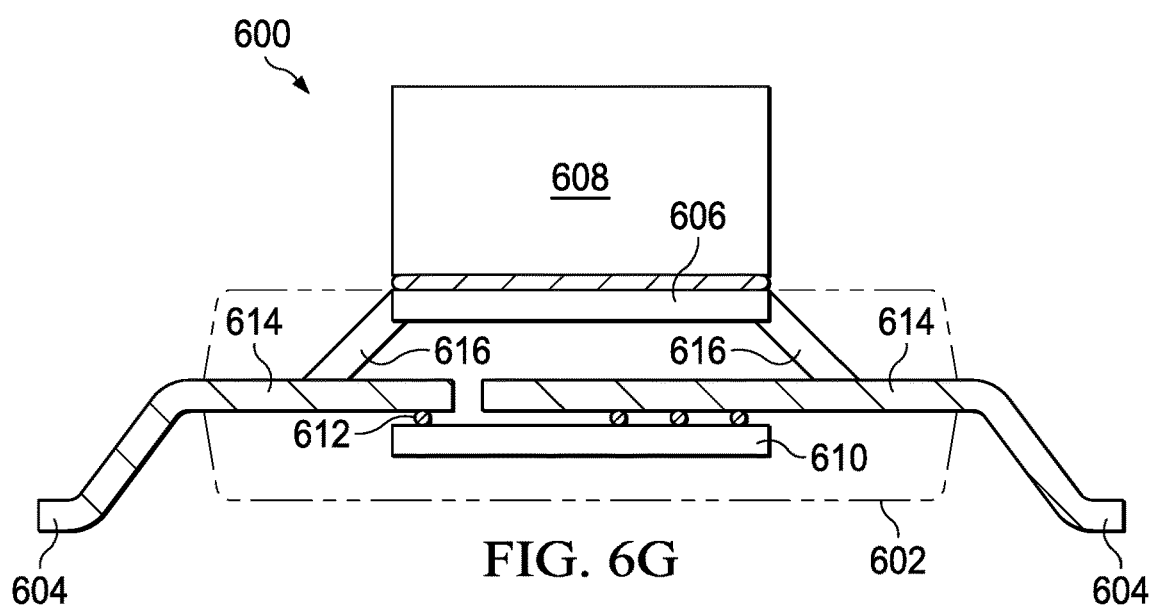
FIG. 6G is a profile, cross-sectional view of a semiconductor package having conductive members coupled to a passive component on a topmost surface, in accordance with various examples.

FIG. 6G is a profile, cross-sectional view of the package 600, in accordance with various examples. In such examples, the package 600 includes a mold compound 602, leads 604, conductive members 606, a passive component 608 coupled to the conductive members 606, and a semiconductor die 610. The semiconductor die 610 is coupled to conductive structures 614 by conductive bumps 612 (e.g., solder balls). The structures 614 may be coupled to the leads 604, as shown. Further, conductive structures 616 may be coupled to the leads 604 and/or structures 614. The structures 616 extend upward toward the topmost surface of the mold compound 602. A conductive member 606 is exposed to a top surface of the package 600 and is coupled to multiple structures 616, as shown. The multiple structures 616 are angled upward and medially toward the topmost surface of the mold compound 602. In the configuration of FIG. 6G, the device side of the semiconductor die 610 faces upward. However, in some examples, the semiconductor die 610 may be oriented to face downward and may be positioned above the structures 614.

Figure 7A:
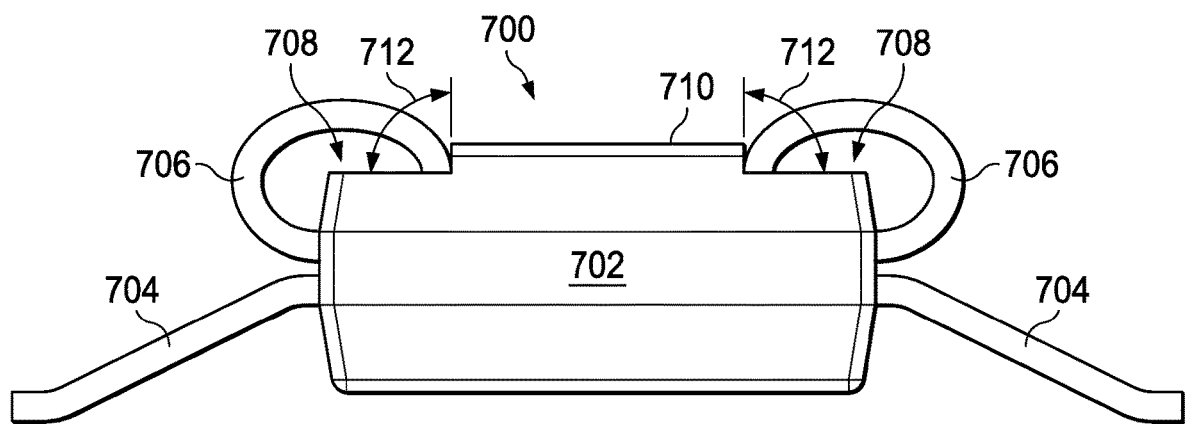
FIG. 7A is a profile view of a semiconductor package having leads in a trench on a topmost surface, in accordance with various examples.
Figure 7B:
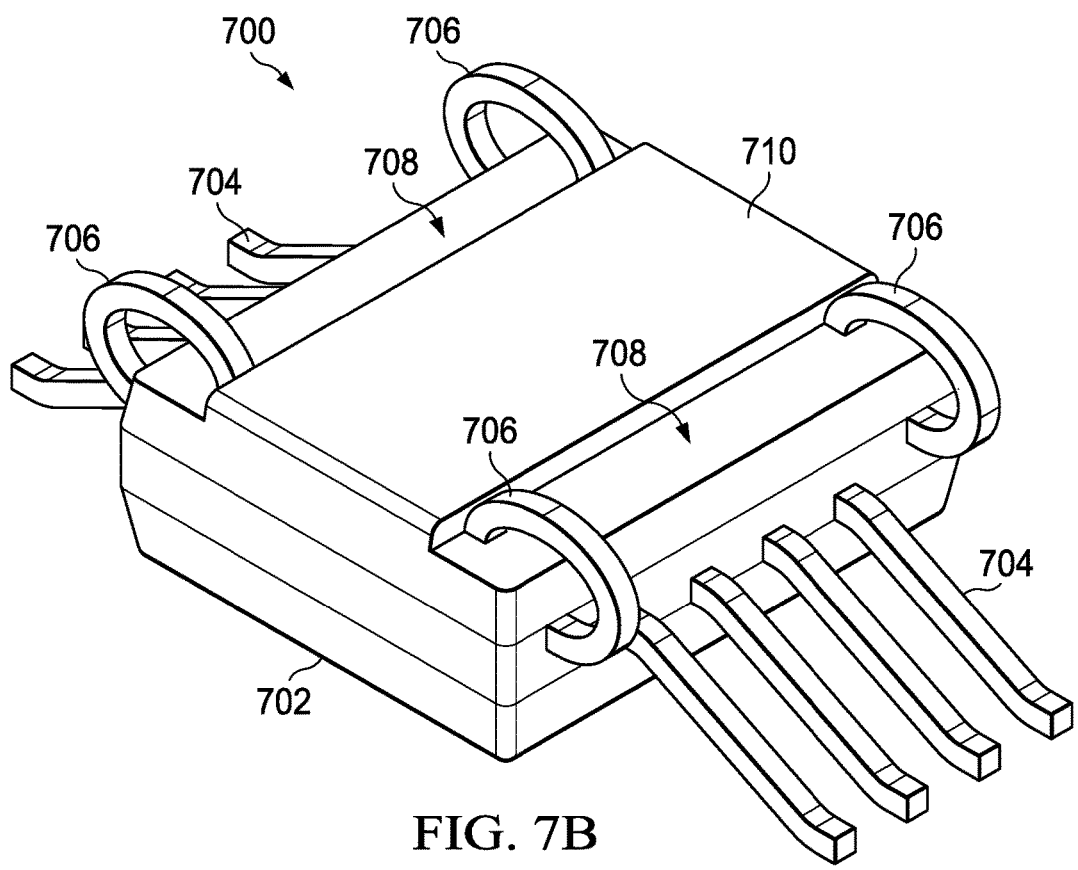
FIG. 7B is a perspective view of a semiconductor package having leads in a trench on a topmost surface, in accordance with various examples.
Figure 7C:
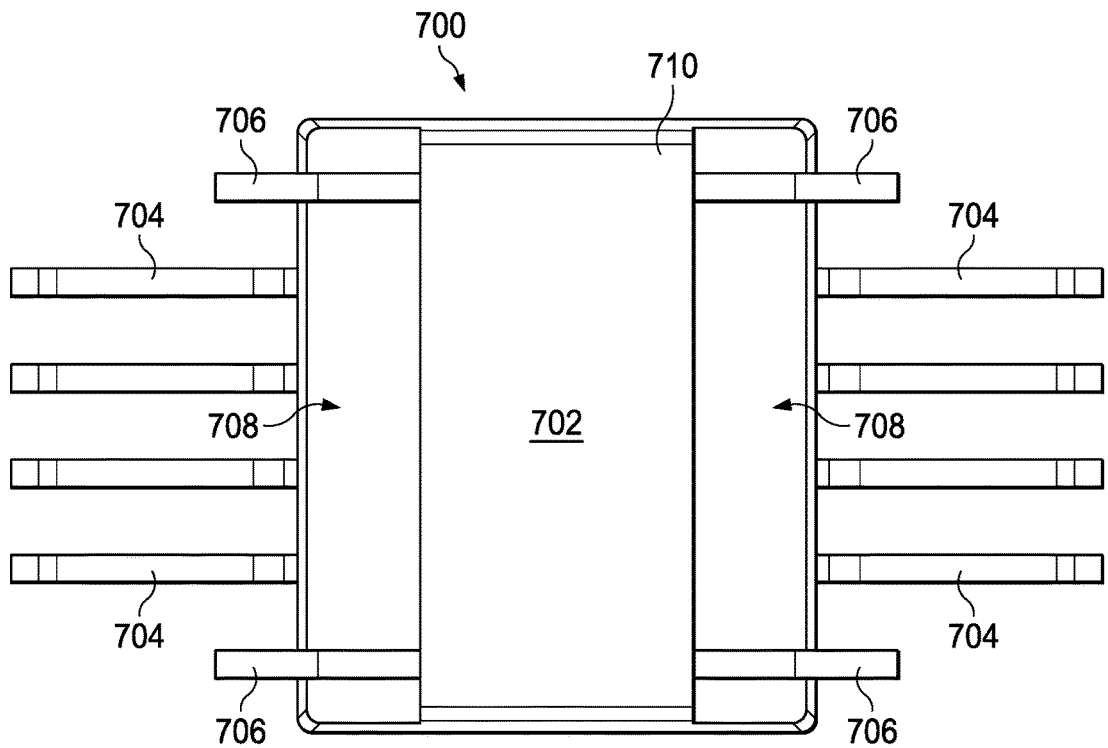
FIG. 7C is a top-down view of a semiconductor package having leads in a trench on a topmost surface, in accordance with various examples.
Figure 7D:
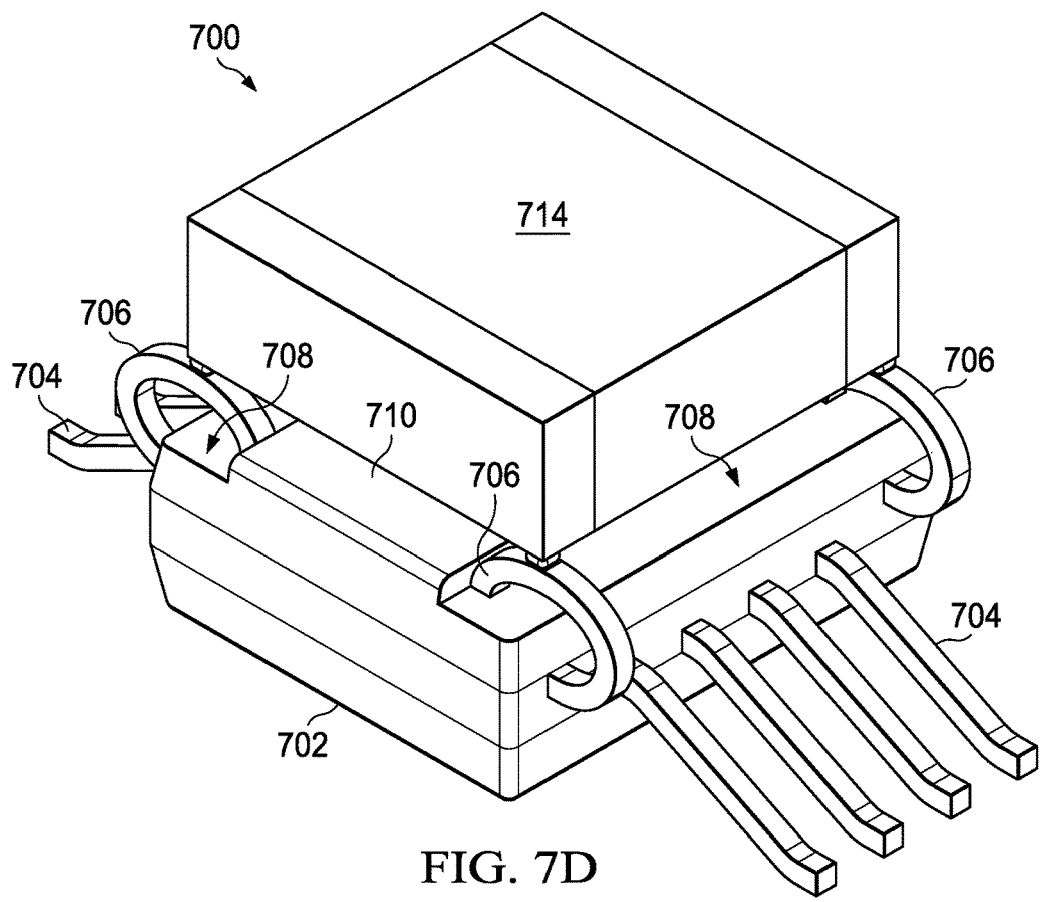
FIG. 7D is a perspective view of a semiconductor package having a passive component coupled to leads in a trench on a topmost surface, in accordance with various examples.

In some examples, leads are shaped and bent to extend outward from a mold compound and then to extend medially and upward toward a topmost surface of the mold compound, such as in FIGS. 1A-1D. In such examples, the entire length of such a lead continuously abuts the mold compound. However, in some examples, the leads are bent and shaped in a different manner such that the leads do not continuously abut the mold compound. Rather, in such examples, a lead abuts the mold compound at specific points (i.e., only at the point at which the lead emerges from the mold compound and the point at which the distal end of the lead contacts the mold compound). FIG. 7A is a profile view of a semiconductor package 700 having such leads in a trench on a topmost surface, in accordance with various examples. The package 700 includes a mold compound 702, leads 704, conductive members 706 (e.g., leads), trenches 708 that extend along a length of the package 700, and a topmost surface 710 of the mold compound 702. The leads 704 may have a gullwing shape. The conductive members 706 are shaped to include an arc, and distal ends of the conductive members 706 are positioned in the trenches 708. For example, the distal ends of the conductive members 706 are positioned in corners of the trenches 708, as shown. Although the conductive members 706 may be unlikely to move or deform, the angles 712 of the trench 708 corners in which the distal ends of the conductive members 706 are positioned are no greater than 90 degrees, thereby providing resistance against movement of the conductive members 706. FIG. 7B is a perspective view of the package 700, in accordance with various examples. FIG. 7C is a top-down view of the package 700, in accordance with various examples. FIG. 7D is a perspective view of the package 700 having a passive component 714 coupled to conductive members 706, in accordance with various examples.

Referring again to FIG. 7A, a conductive member 706 should be of sufficient length relative to the absolute distance between the point at which the conductive member 706 emerges from the mold compound 702 and the corner of the trench 708 such that the conductive member 706 coincides with a horizontal plane that is higher than the topmost surface 710. In this way, when a passive component is coupled to the package 700, the terminals of the passive component will establish contact with the conductive member 706. If the highest point of the conductive member 706 is below the horizontal plane of the topmost surface 710, the passive component will not contact the conductive member 706.

Still referring to FIG. 7A, the conductive member 706 should be shaped to provide adequate surface area with which to couple to the passive component when the passive component is coupled to the package 700. An arc of the conductive member 706 that is excessively sharp will provide inadequate contact area between the conductive member 706 and the passive component. Conversely, an arc of the conductive member 706 that is too flat will not approach the corner of the trench 708 in a manner that provides resistance to subsequent movement, displacement, or deformation by the conductive member 706.

Figure 10:
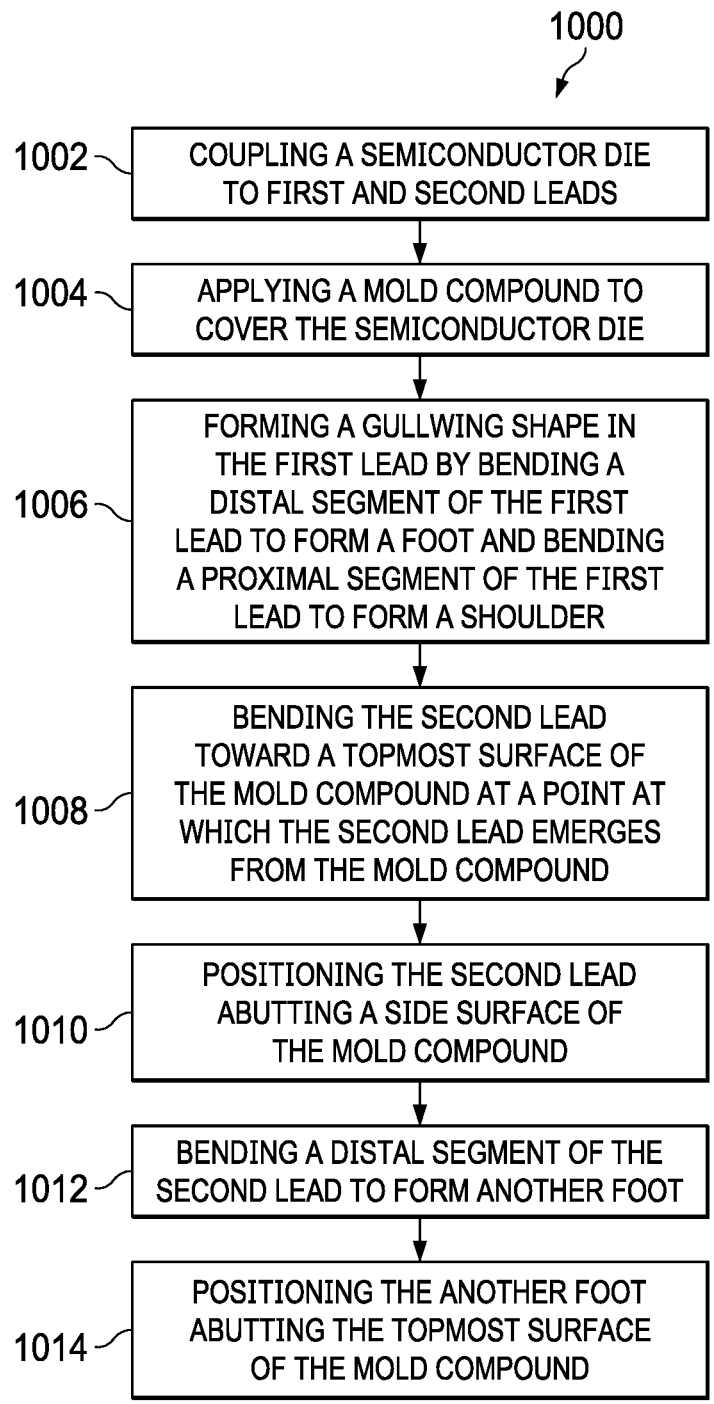
FIG. 10 is a flow diagram of a method for manufacturing a semiconductor package having leads on a topmost surface, in accordance with various examples.

FIGS. 8A-8E are a process flow for manufacturing a semiconductor package having leads on a topmost surface, in accordance with various examples. FIG. 10 is a flow diagram of a method 1000 for manufacturing a semiconductor package having leads on a topmost surface, in accordance with various examples. Accordingly, FIGS. 8A-8E and FIG. 10 are now described in parallel.

Figure 8A:
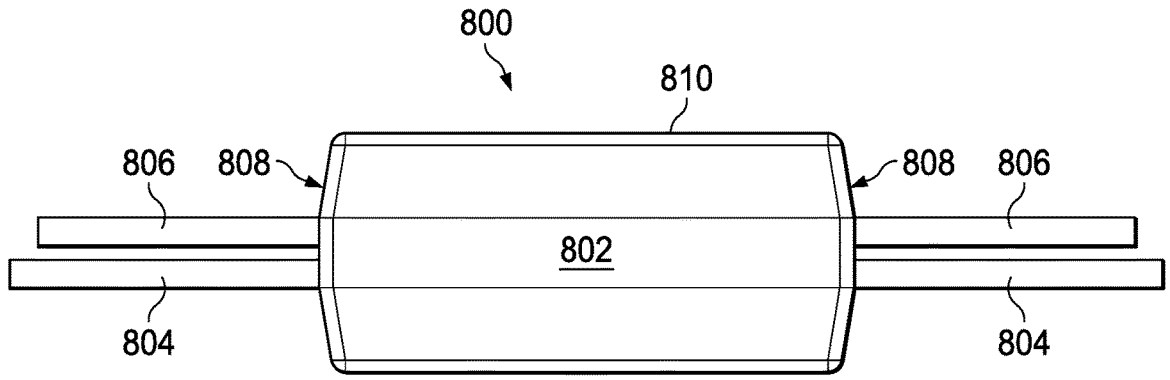
FIGS. 8A-8E are a process flow for manufacturing a semiconductor package having leads on a topmost surface, in accordance with various examples.
Figure 8B:
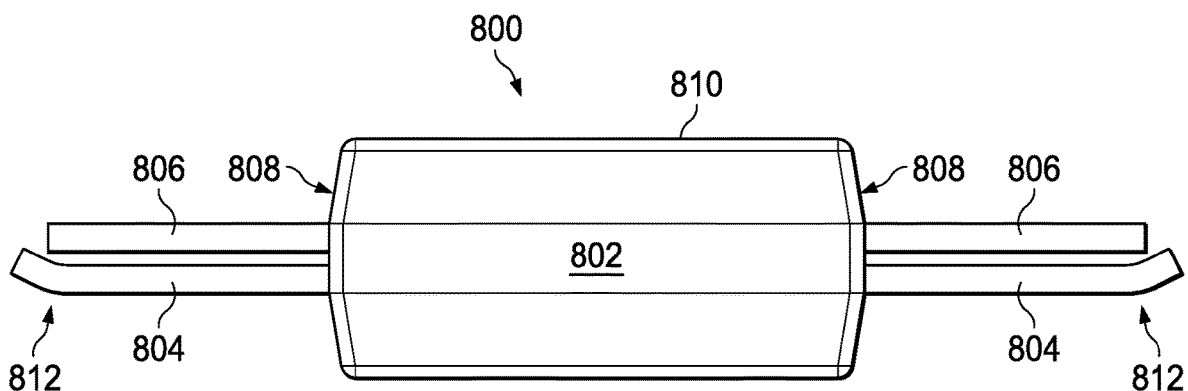
Figure 8C:
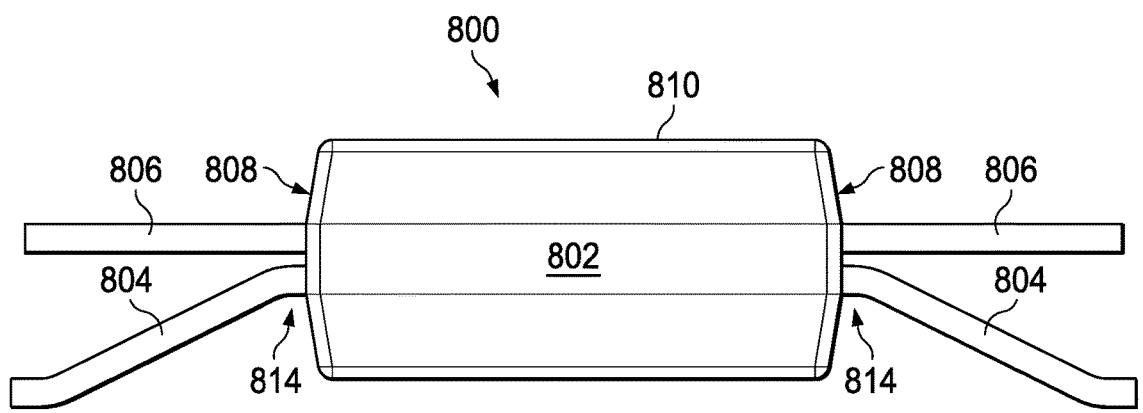
Figure 8D:
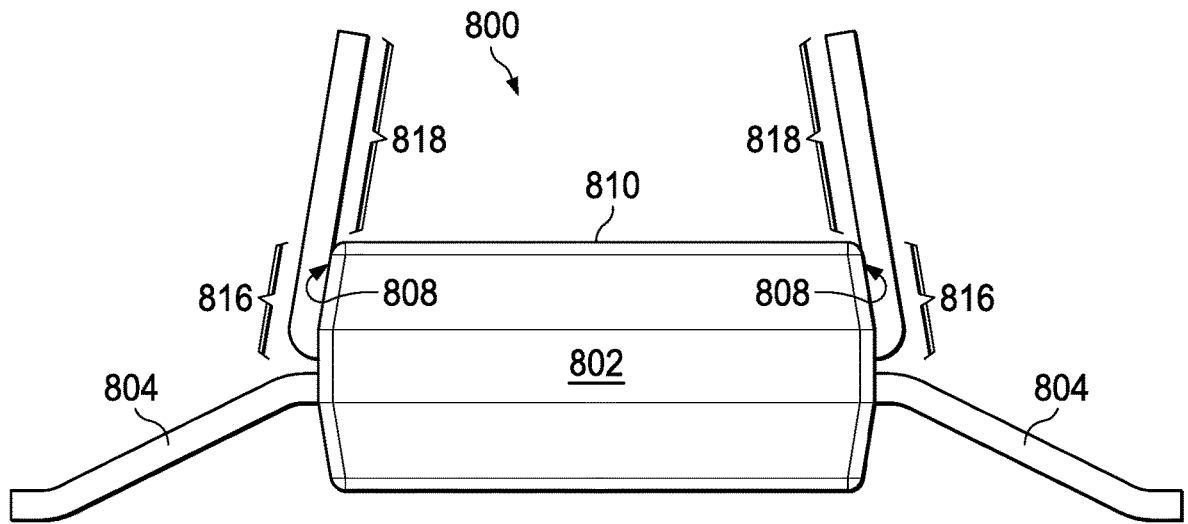

The method 1000 begins with coupling a semiconductor die to first and second leads (1002) and applying a mold compound to cover the semiconductor die (1004). As described above, the semiconductor die may be coupled to the first and second leads by bond wires, conductive bumps, etc. FIG. 8A is a profile view of an example semiconductor package 800 having a mold compound 802, a first lead 804, a second lead 806, a surface 808 (e.g., a side surface), and a topmost surface 810 of the mold compound 802. Although the first lead 804 and the second lead 806 are in the same horizontal plane and are of approximately the same length, in FIGS. 8A-8E these leads are shown as being of different lengths and in different horizontal planes so the process flow is more readily understood. The method 1000 includes forming a gullwing shape in the first lead by bending a distal segment of the first lead to form a foot and bending a proximal segment of the first lead to form a shoulder (1006). FIG. 8B shows the formation of a foot 812 in the first lead 804. FIG. 8C shows the formation of a shoulder 814 in the first lead 804. The method 1000 includes bending the second lead toward a topmost surface of the mold compound at a point at which the second lead emerges from the mold compound (1008) and positioning the second lead abutting a side surface of the mold compound (1010). FIG. 8D shows a bending of the second lead 806 at the point at which the second lead 806 emerges from the mold compound 802 such that the second lead 806 is oriented medially and upward toward the topmost surface 810. More specifically, a proximal segment 816 of the second lead 806 abuts the surface 808, and a distal segment of the second lead 806 extends above the topmost surface 810.

Figure 8E:
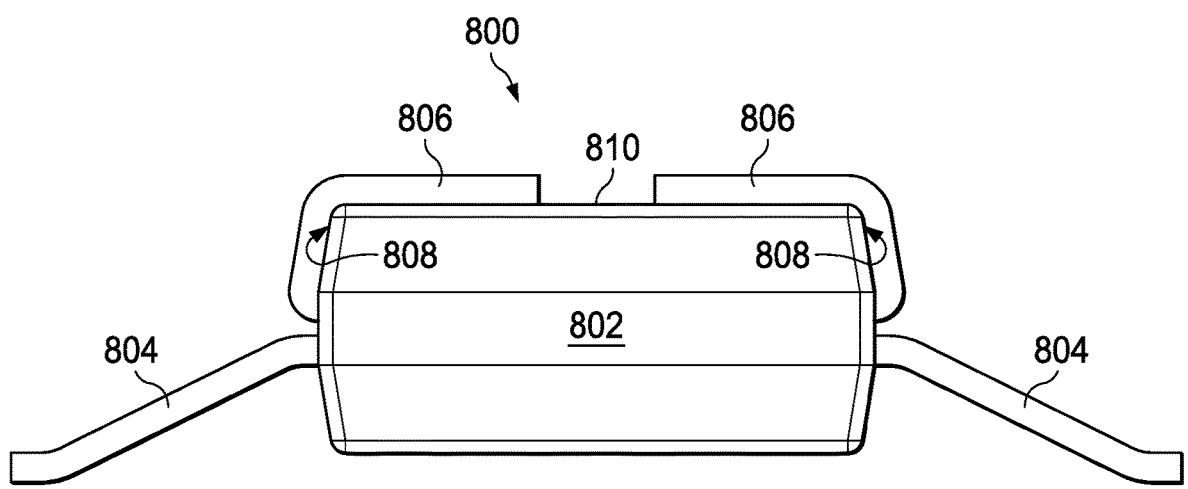

The method 1000 includes bending a distal segment of the second lead to form another foot (1012) and positioning the another foot abutting the topmost surface of the mold compound (1014). FIG. 8E shows the same structure as FIG. 8D, except that the distal segment 818 abuts the topmost surface 810. The distal segment 818 may be referred to herein as a foot.

Figure 11:
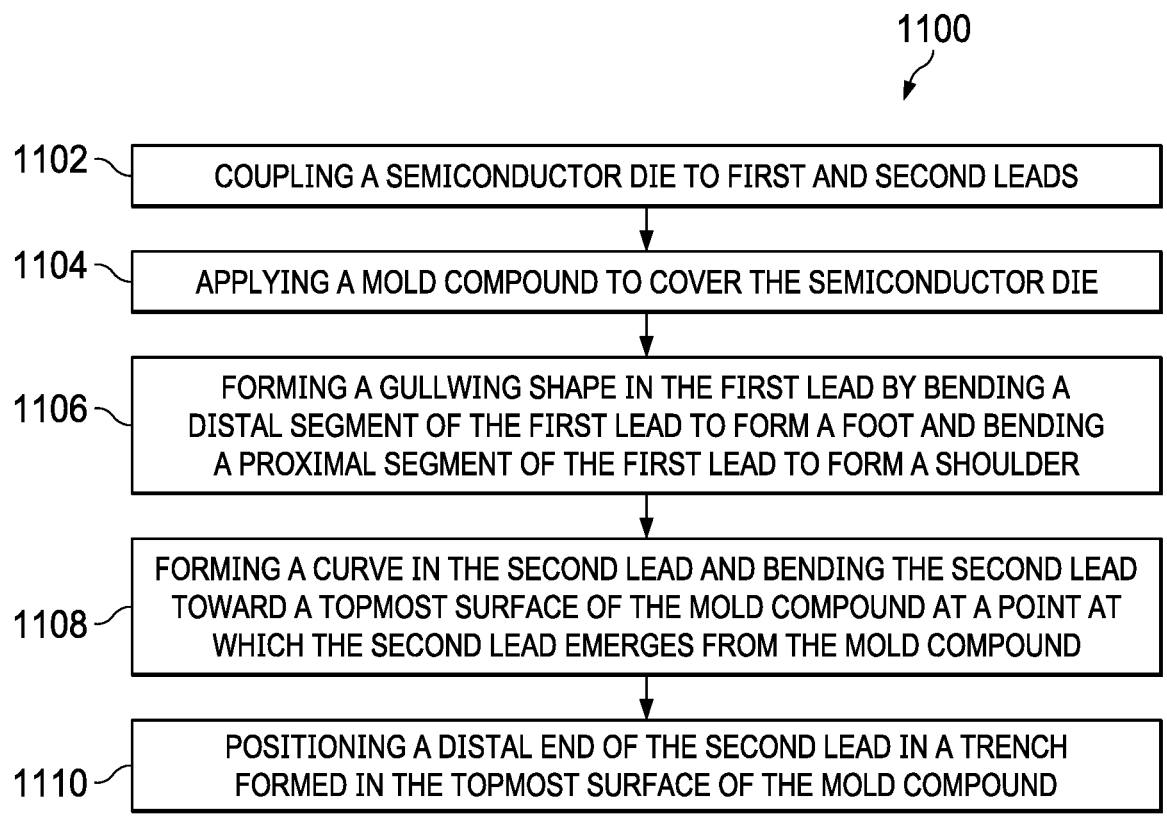
FIG. 11 is a flow diagram of a method for manufacturing a semiconductor package having leads in a trench on a topmost surface, in accordance with various examples.

FIGS. 9A-9E are a process flow for manufacturing a semiconductor package having leads in a trench on a topmost surface, in accordance with various examples. FIG. 11 is a flow diagram of a method 1100 for manufacturing a semiconductor package having leads in a trench on a topmost surface, in accordance with various examples. Accordingly, FIGS. 9A-9E and FIG. 11 are now described in parallel.

Figure 9A:
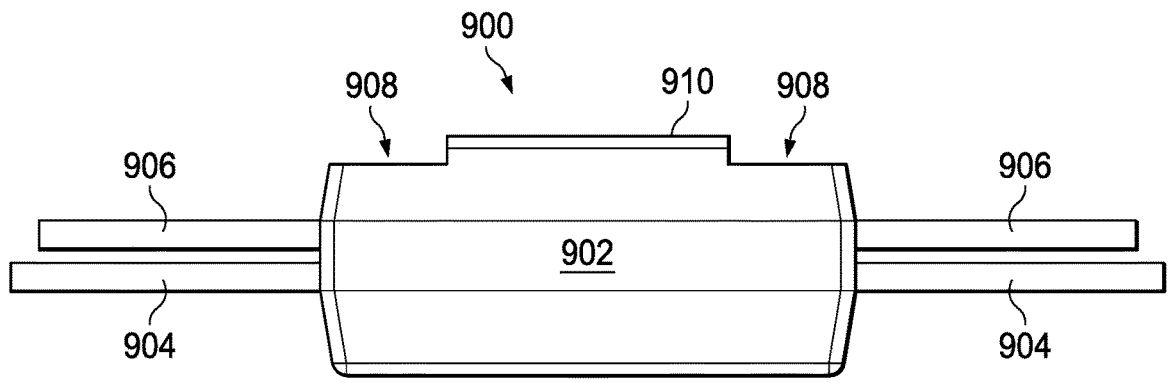
FIGS. 9A-9E are a process flow for manufacturing a semiconductor package having leads in a trench on a topmost surface, in accordance with various examples.
Figure 9B:
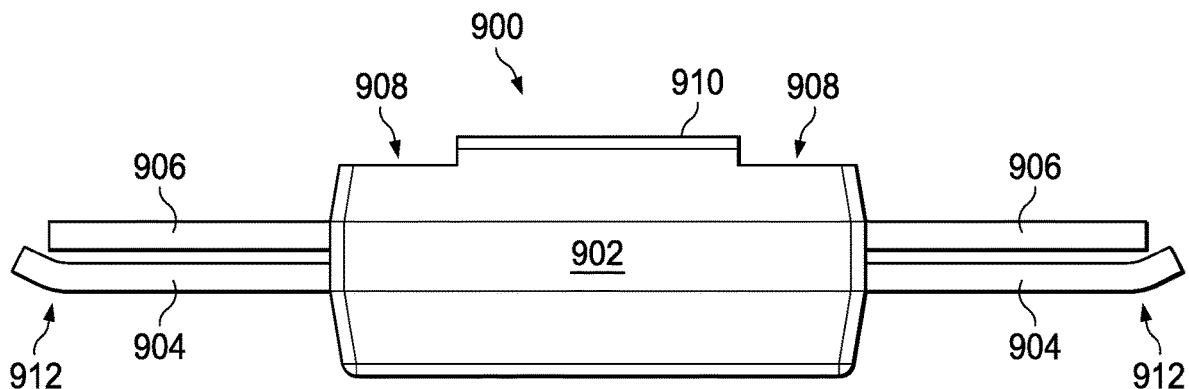
Figure 9C:
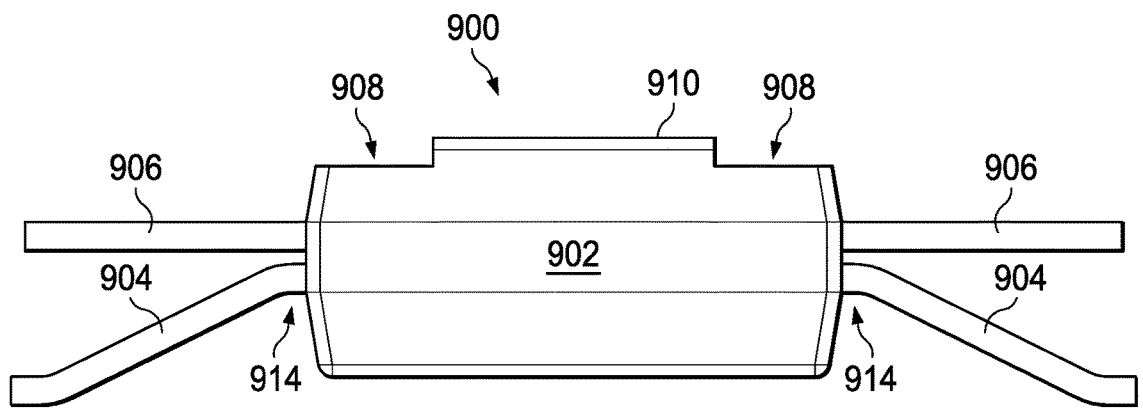
Figure 9D:
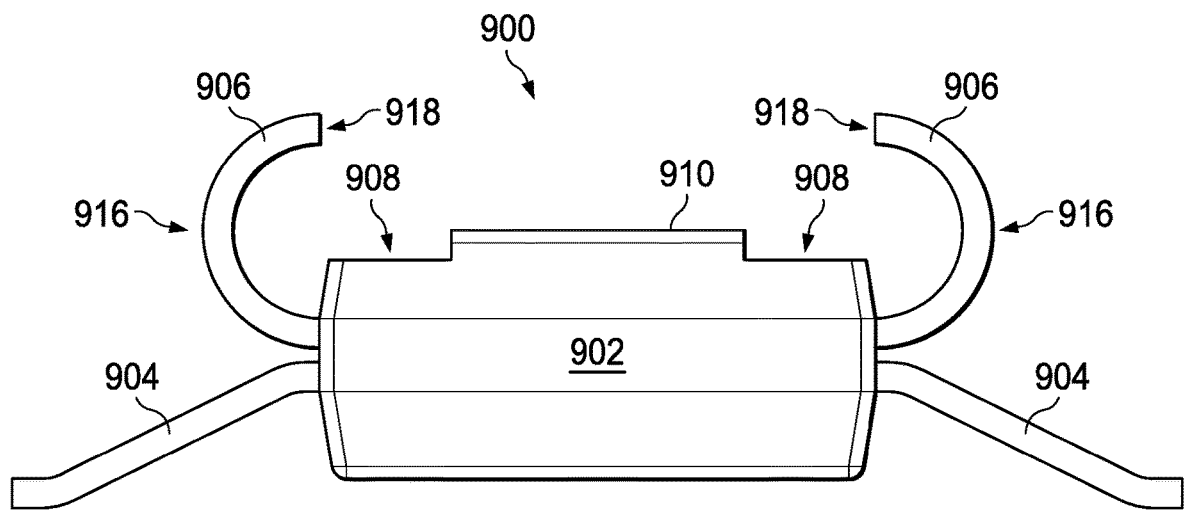
Figure 9E:
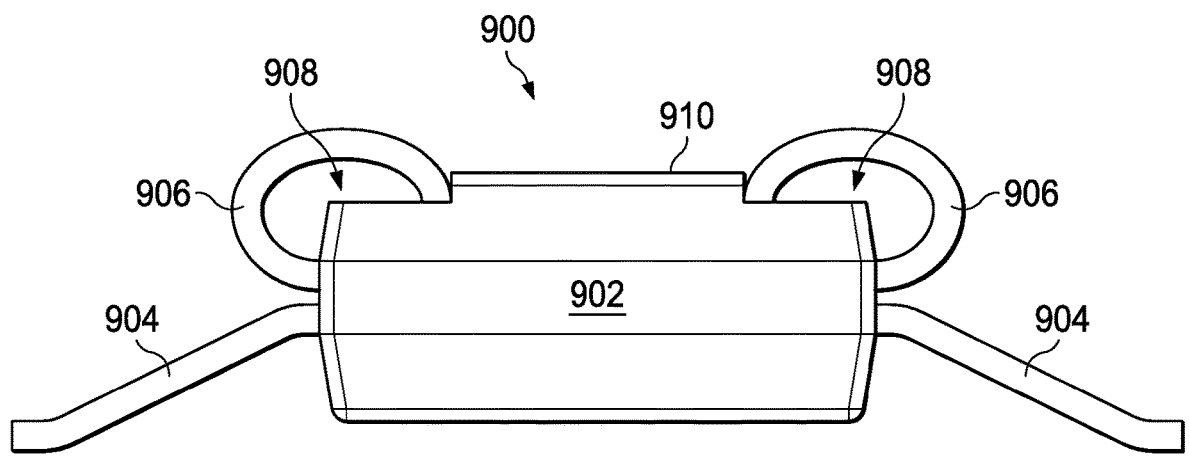

The method 1100 includes coupling a semiconductor die to first and second leads (1102) and applying a mold compound to cover the semiconductor die (1104). FIG. 9A shows a profile view of a semiconductor package 900 having a mold compound 902, a first lead 904, a second lead 906, a trench 908, and a topmost surface 910 of the mold compound 902. Although the first lead 904 and the second lead 906 are in the same horizontal plane and are of approximately the same length, in FIGS. 9A-9E these leads are shown as being of different lengths and in different horizontal planes so the process flow is more readily understood. The method 1100 includes forming a gullwing shape in the first lead by bending a distal segment of the first lead to form a foot, and bending a proximal segment of the first lead to form a shoulder (1106). FIG. 9B shows the formation of a foot 912 and FIG. 9C shows the formation of a shoulder 914. The method 1000 includes forming a curve in the second lead and bending the second lead toward a topmost surface of the mold compound at a point at which the second lead emerges from the mold compound (1108). FIG. 9D shows a curve 916 formed in the second lead 906 and a distal end 918 being guided toward the trench 908. The method 1000 further includes positioning a distal end of the second lead in a trench formed in the topmost surface of the mold compound (1110). FIG. 9E shows the distal end 918 being positioned in the corner of the trench 908.

Figure 12:
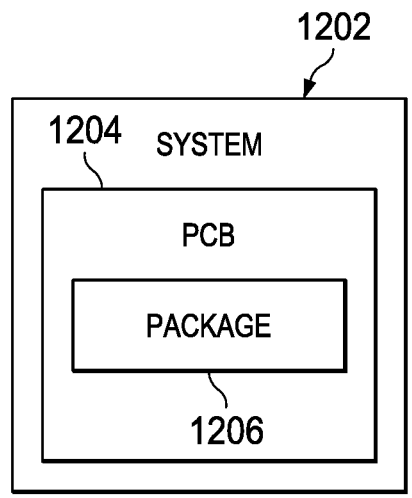
FIG. 12 is a block diagram of a system including a semiconductor package having leads on a topmost surface, in accordance with various examples.

FIG. 12 is a block diagram of a system 1202, such as a power system, an electronic device, a consumer device, an appliance, a smartphone, an entertainment device, etc. The system 1202 includes a PCB 1204. A semiconductor package 1206 is coupled to the PCB 1204. The semiconductor package 1206 may be similar to any of the example semiconductor packages described herein.

What is claimed is:

1. A semiconductor package, comprising:
 a semiconductor die including a device side having a circuit;
 a mold compound covering the semiconductor die and the circuit;
 a first lead coupled to the circuit, the first lead having a gullwing shape and emerging from the mold compound in a first horizontal plane, the first lead having a distal end coincident with a second horizontal plane lower than a bottom surface of the mold compound; and
 a second lead coupled to the circuit, the second lead emerging from the mold compound in the first horizontal plane, the second lead having at least one curved segment and a distal end positioned in a trench formed in a topmost surface of the mold compound.

2. The semiconductor package of claim 1, wherein the second lead is coincident with a third horizontal plane that is above the topmost surface of the mold compound.

3. The semiconductor package of claim 1, wherein the trench includes a corner having an angle that is 90 degrees or less.

4. The semiconductor package of claim 1, wherein the second lead does not contact the mold compound other than at the distal end and at a segment of the second lead that emerges from the mold compound.

5. The semiconductor package of claim 1, further comprising an inductor coupled to the second lead and positioned above the topmost surface of the mold compound.

6. The semiconductor package of claim 1, wherein the distal end of the first lead is not vertically coincident with the mold compound.

7. The semiconductor package of claim 1, wherein the first and second leads are electrically coupled to each other.

8. The semiconductor package of claim 1, wherein the semiconductor die is coupled to the first and second leads by bond wires.

9. The semiconductor package of claim 1, wherein the device side of the semiconductor die is downward facing and is coupled to the first and second leads by conductive bumps.

10. The semiconductor package of claim 1, wherein the device side of the semiconductor die is upward facing and is coupled to the first and second leads by conductive bumps.

11. A semiconductor package, comprising:
a semiconductor die including a device side having a circuit;
a mold compound covering the semiconductor die and the circuit;
first and second pairs of leads coupled to the circuit, the first pair of leads emerging from different side surfaces of the mold compound, the second pair of leads emerging from the different side surfaces of the mold compound;
a first conductive member exposed to a topmost surface of the mold compound and coupled to the first pair of leads at locations within the mold compound; and
a second conductive member exposed to the topmost surface of the mold compound and coupled to the second pair of leads at locations within the mold compound.

12. The semiconductor package of claim 11, further comprising a passive component positioned on the topmost surface of the mold compound and coupled to the first and second conductive members.

13. The semiconductor package of claim 11, wherein a third conductive member couples the first conductive member to a lead in the first pair of leads, and wherein the third conductive member is oriented at an angle relative to the topmost surface of the mold compound.

14. The semiconductor package of claim 11, wherein the first and second conductive members are not exposed to a bottom surface of the mold compound, and wherein the topmost and bottom surfaces are approximately parallel.

15. The semiconductor package of claim 11, wherein the semiconductor die is coupled to the first and second pairs of leads by bond wires.

16. The semiconductor package of claim 11, wherein the device side of the semiconductor die is downward facing and is coupled to the first and second pairs of leads by conductive bumps.

17. The semiconductor package of claim 11, wherein the device side of the semiconductor die is upward facing and is coupled to the first and second pairs of leads by conductive bumps.

18. A method for manufacturing a semiconductor package, comprising:
coupling a semiconductor die to first and second leads;
applying a mold compound to cover the semiconductor die;
forming a gullwing shape in the first lead by bending a distal segment of the first lead to form a foot and bending a proximal segment of the first lead to form a shoulder;
forming a curve in the second lead and bending the second lead toward a topmost surface of the mold compound at a point at which the second lead emerges from the mold compound; and
positioning a distal end of the second lead in a trench formed in the topmost surface of the mold compound.

* * * * *